US011715798B2

(12) United States Patent
Chiang et al.

(10) Patent No.: US 11,715,798 B2
(45) Date of Patent: Aug. 1, 2023

(54) FEFET OF 3D STRUCTURE FOR CAPACITANCE MATCHING

(71) Applicant: Taiwan Semiconductor Manufacturing Company, Ltd., Hsin-Chu (TW)

(72) Inventors: Hung-Li Chiang, Taipei (TW); Chih-Sheng Chang, Hsinchu (TW); Tzu-Chiang Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/674,061

(22) Filed: Feb. 17, 2022

(65) Prior Publication Data

US 2022/0173250 A1 Jun. 2, 2022

Related U.S. Application Data

(62) Division of application No. 16/733,398, filed on Jan. 3, 2020, now Pat. No. 11,289,602.

(51) Int. Cl.
    *H01L 29/78* (2006.01)
    *H01L 27/088* (2006.01)
    *H01L 29/66* (2006.01)

(52) U.S. Cl.
    CPC .... *H01L 29/78391* (2014.09); *H01L 27/0886* (2013.01); *H01L 29/66545* (2013.01); *H01L 29/66795* (2013.01)

(58) Field of Classification Search
    CPC .................................................. H01L 29/78391
    See application file for complete search history.

(56) References Cited

U.S. PATENT DOCUMENTS

| 6,107,656 | A | 8/2000 | Igarashi |
| 6,258,658 | B1 | 7/2001 | Boehm et al. |
| 6,411,548 | B1 | 6/2002 | Sakui et al. |
| 6,642,564 | B2 | 11/2003 | Ogawa et al. |
| 9,263,577 | B2 | 2/2016 | Ramaswamy et al. |

(Continued)

FOREIGN PATENT DOCUMENTS

KR 20080092812 A 10/2008

OTHER PUBLICATIONS

Non-Final Office Action dated Apr. 23, 2021 for U.S. Appl. No. 16/733,398.

(Continued)

*Primary Examiner* — William A Harriston
(74) *Attorney, Agent, or Firm* — Eschweiler & Potashnik, LLC

(57) ABSTRACT

An MFMIS-FET includes a MOSFET having a three-dimensional structure that allows the MOSFET to have an effective area that is greater than the footprint of the MFM or the MOSFET. In some embodiment, the gate electrode of the MOSFET and the bottom electrode of the MFM are united. In some, they have equal areas. In some embodiments, the MFM and the MOSFET have nearly equal footprints. In some embodiments, the effective area of the MOSFET is much greater than the effective area of the MFM. These structures reduce the capacitance ratio between the MFM structure and the MOSFET without reducing the area of the MFM structure in a way that would decrease drain current.

20 Claims, 23 Drawing Sheets

(56) References Cited

U.S. PATENT DOCUMENTS

| | | |
|---|---|---|
| 10,438,645 B2 | 10/2019 | Mueller et al. |
| 10,818,562 B2 | 10/2020 | Lin et al. |
| 10,868,132 B2 | 12/2020 | Lee et al. |
| 2004/0042290 A1 | 3/2004 | Tarui et al. |
| 2009/0039341 A1 | 2/2009 | Marsman et al. |
| 2016/0064510 A1* | 3/2016 | Mueller .............. H01L 29/6684 257/295 |
| 2016/0111420 A1 | 4/2016 | Zhang et al. |
| 2018/0350800 A1 | 12/2018 | Chang et al. |
| 2020/0243687 A1 | 7/2020 | Ota et al. |

OTHER PUBLICATIONS

Notice of Allowance dated Aug. 31, 2021 for U.S. Appl. No. 16/733,398.

\* cited by examiner

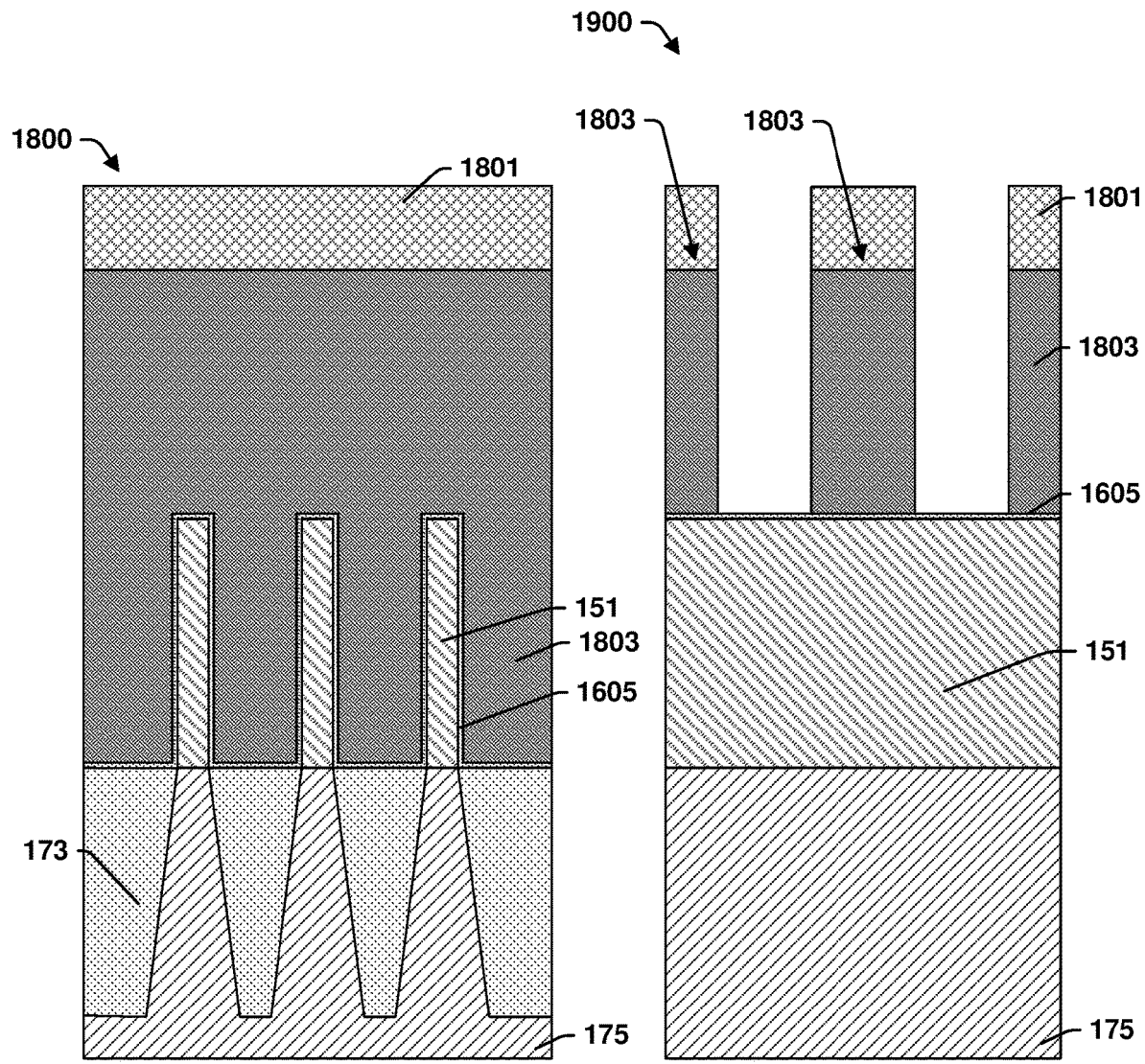

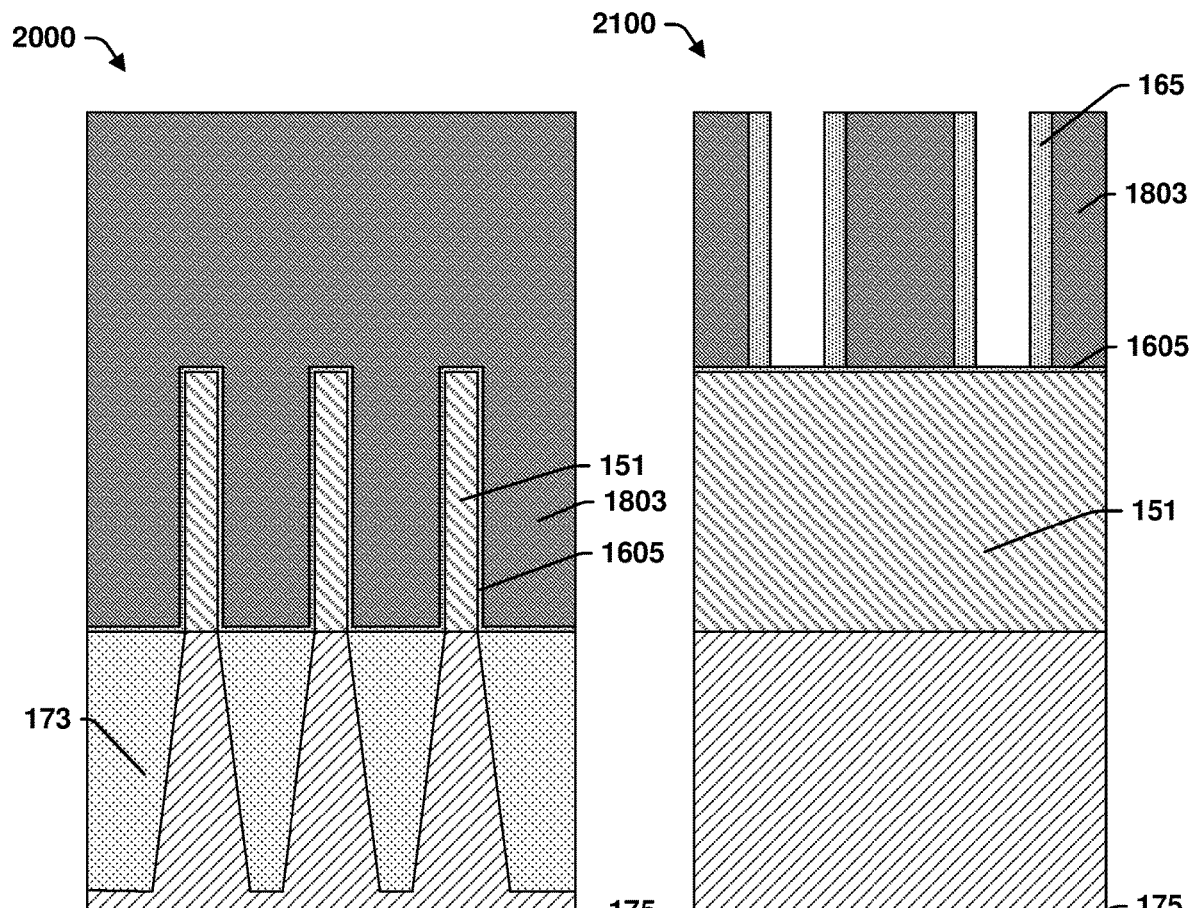

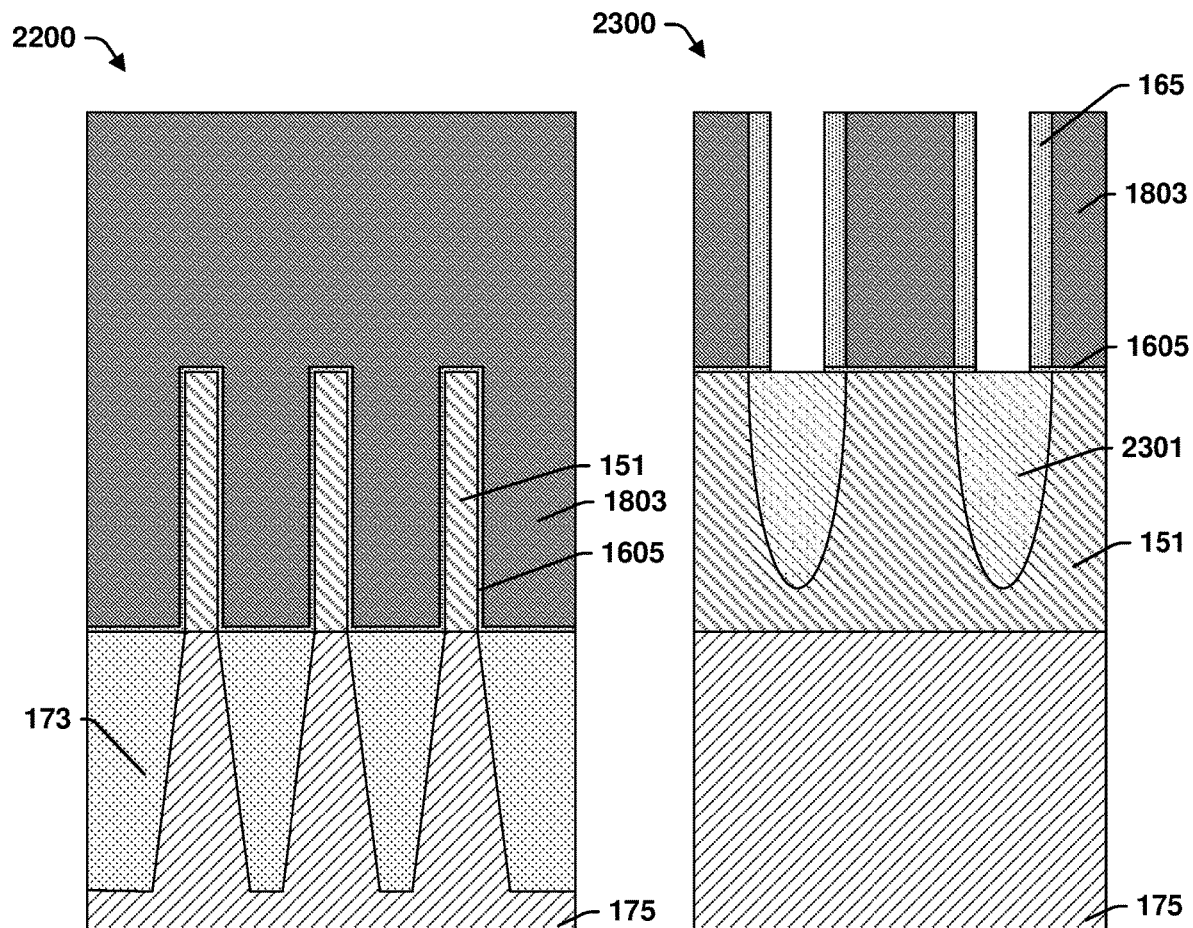

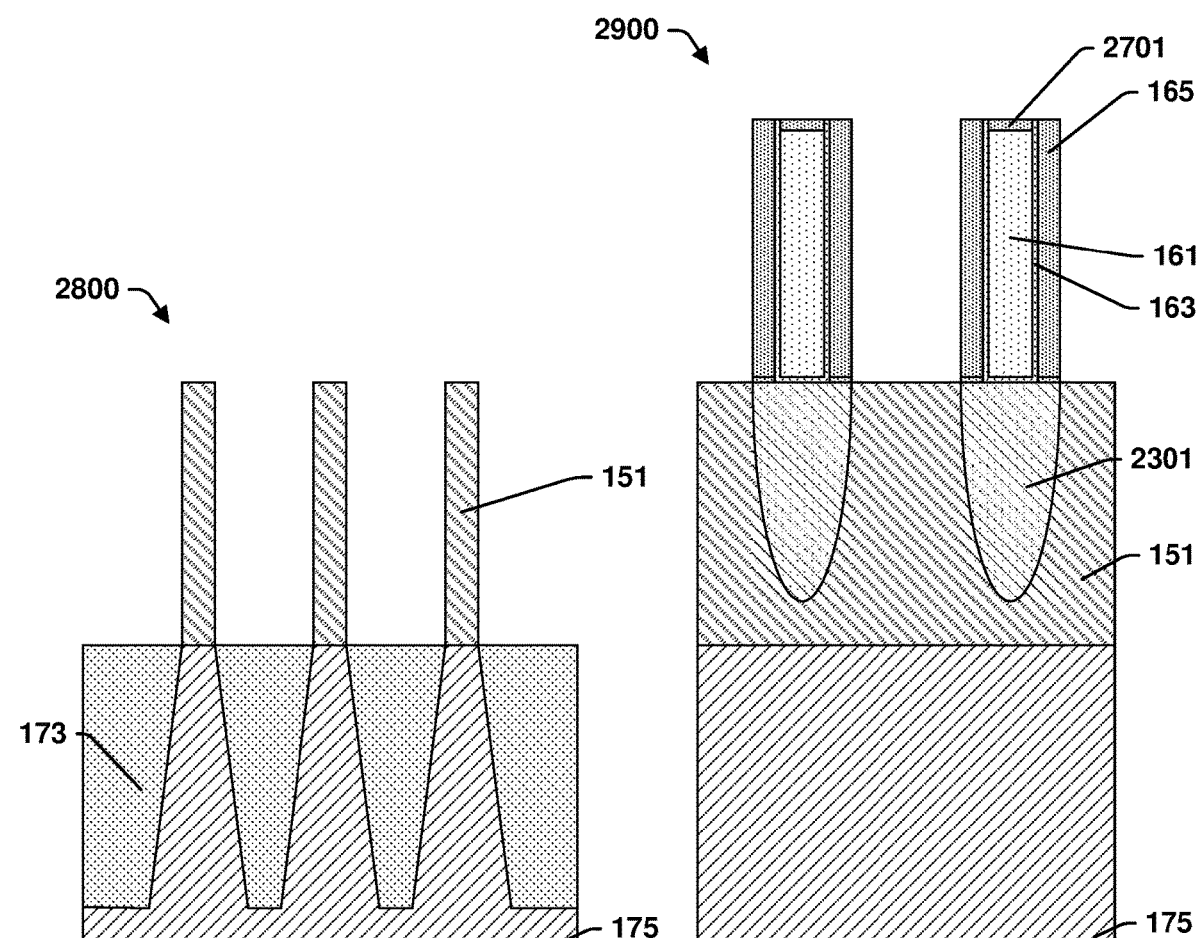

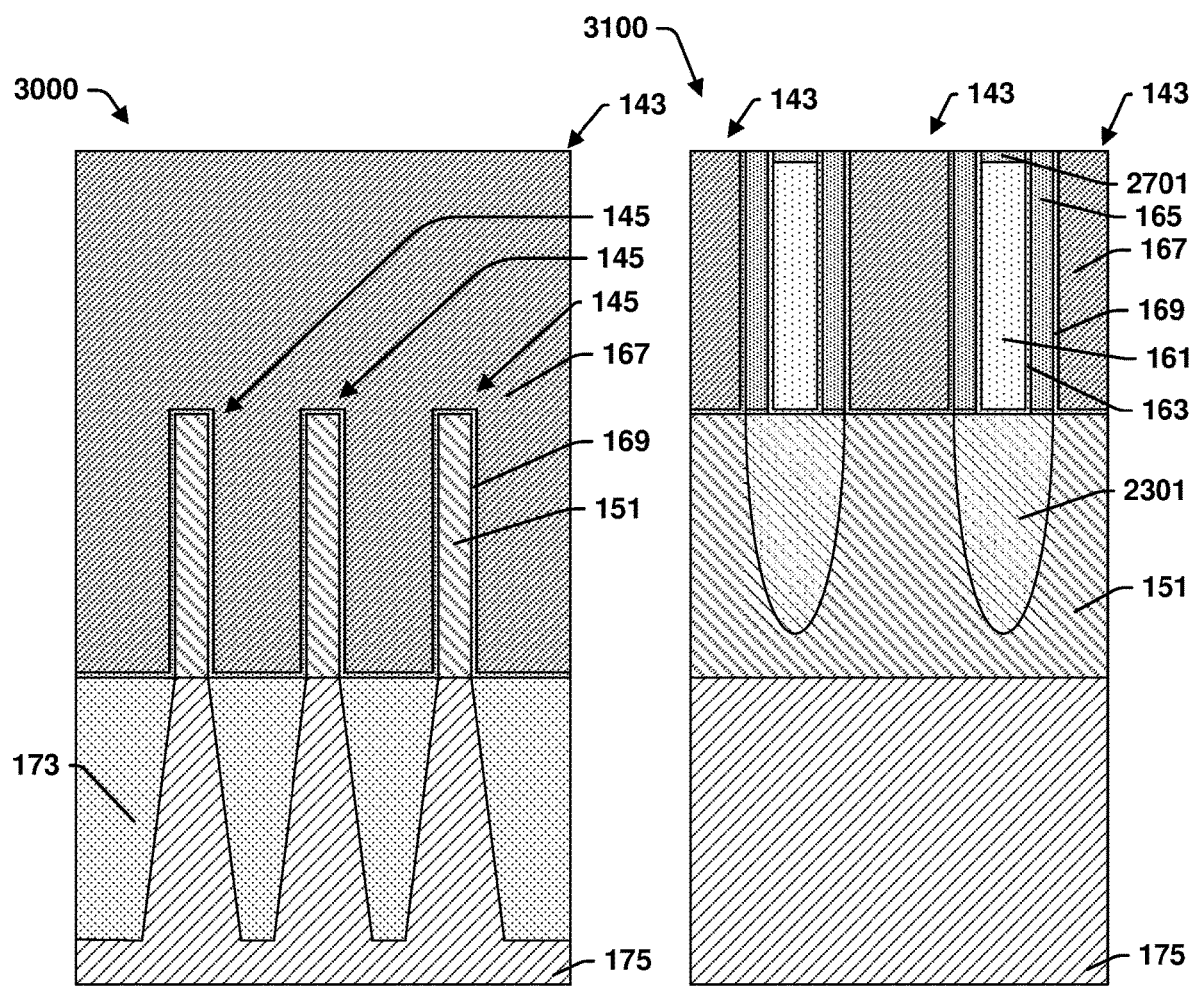

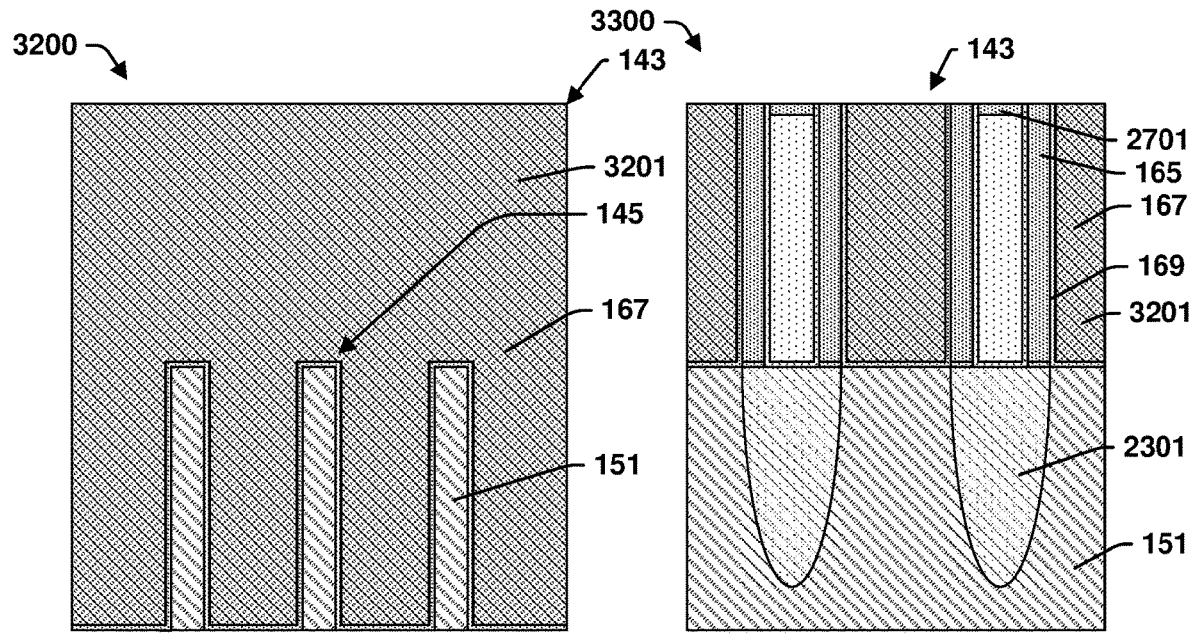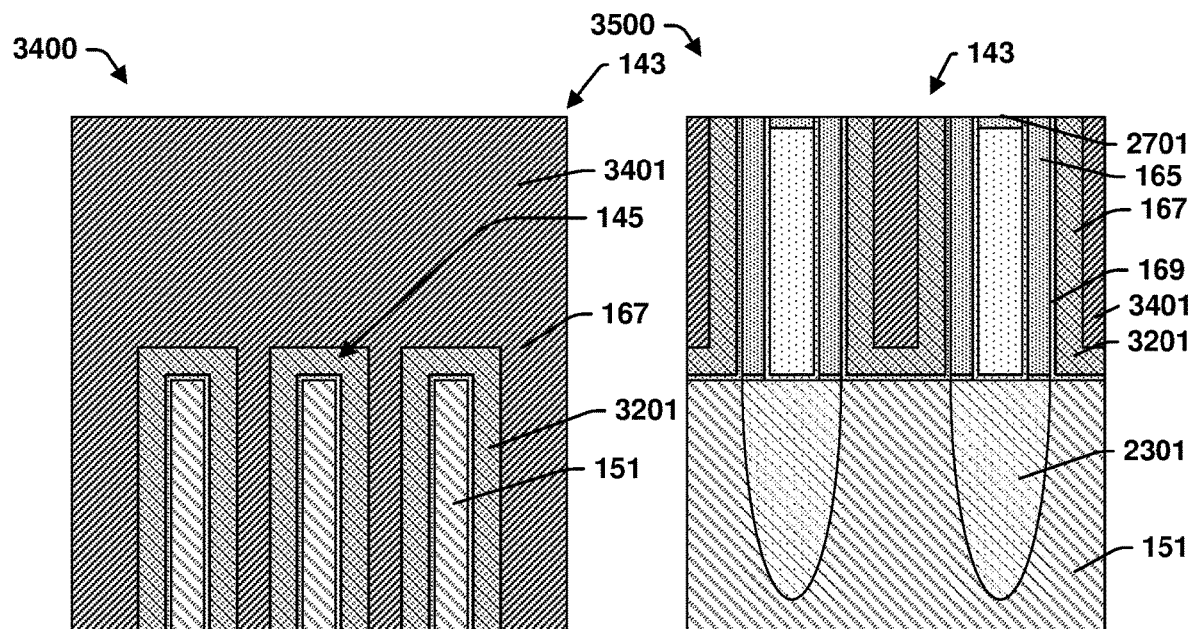

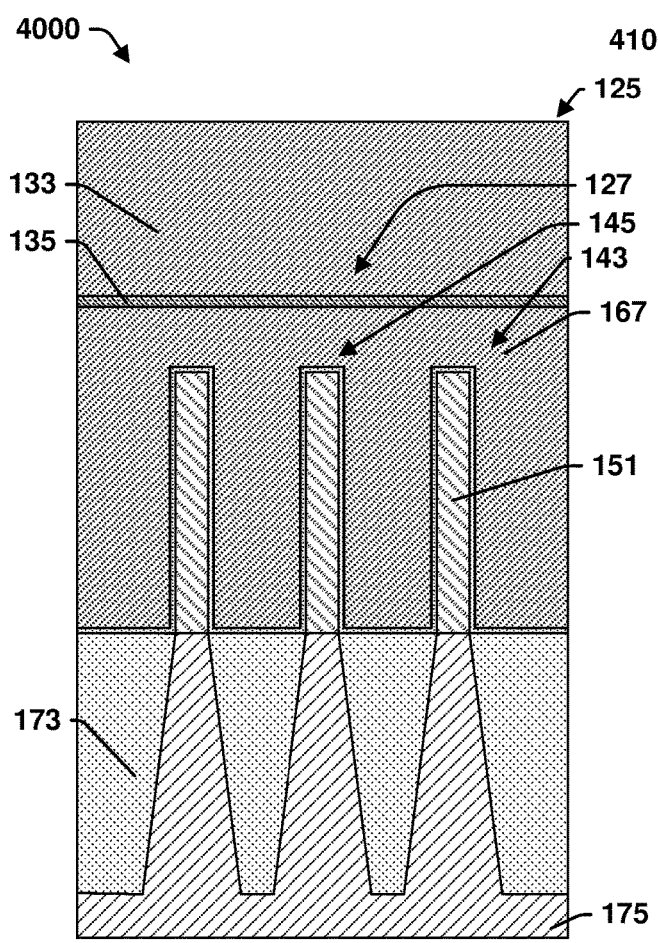
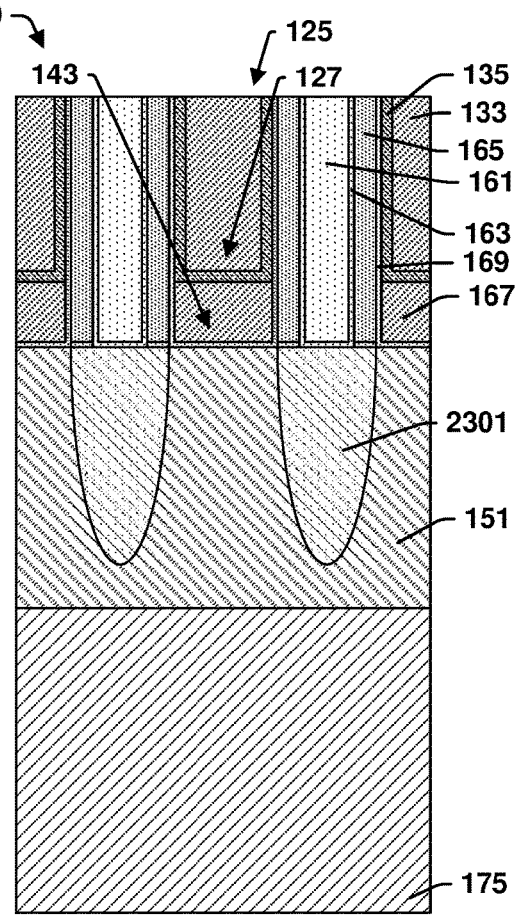
Fig. 40
Fig. 41

FEFET OF 3D STRUCTURE FOR CAPACITANCE MATCHING

REFERENCE TO RELATED APPLICATION

This Application is a Divisional of U.S. application Ser. No. 16/733,398, filed on Jan. 3, 2020, the contents of which are hereby incorporated by reference in their entirety.

BACKGROUND

Many modern-day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6-47 illustrate a series of cross-sectional views of an IC device according to some aspects of the present teachings undergoing a manufacturing process according to some aspects of the present teachings. The even numbered of these figures correspond geometrically to the cross-section 210 of FIG. 2. The odd numbered of these figures correspond geometrically to the cross-section 220 of FIG. 2.

DETAILED DESCRIPTION

Figure 1:
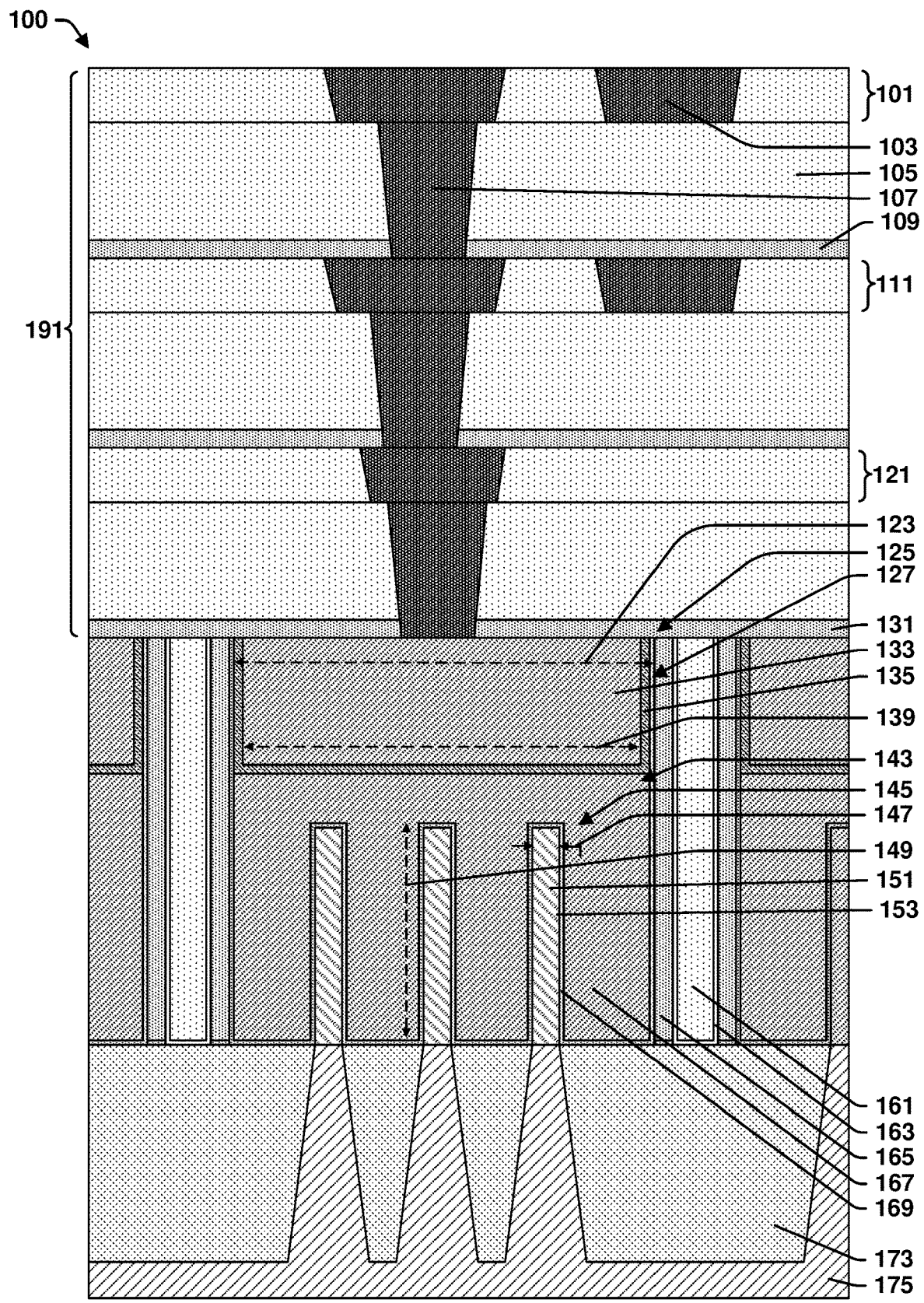
FIG. 1 illustrates a cross-sectional view of an integrated circuit (IC) device with MFMIS-FETs according to some aspects of the present teachings.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) device according to the present disclosure includes ferroelectric random-access memory (FeRAM). FeRAM has a metal/ferroelectric layer/metal (MFM) structure in which a ferroelectric layer is arranged between two metal layers providing top and bottom electrodes. FeRAM stores data through a reversible process of switching between polarization states. The polarization states may be altered using an electric field that changes a polarization maintained by the ferroelectric layer's crystal structure. For example, a negative voltage bias applied to a ferroelectric layer may induce atoms to shift into a first orientation, which has a first resistance indicating a first data value (e.g., a logical '1'), whereas a positive voltage bias applied to the ferroelectric layer may induce atoms to shift into a second orientation, which has a second resistance indicating a second data value (e.g., a logical '0').

One type of FeRAM has transistors connected with capacitors, for example 1T1C cell structured FeRAM in which an MFM is coupled to a drain of a metal-oxide-semiconductor field effect transistor (MOSFET or FET). Another type of FeRAM is a metal-ferroelectric-insulator-semiconductor field-effect transistor (MFIS-FET or FeFET), which is essentially a metal gate FET with a ferroelectric layer between the oxide and the gate. A third type of FeRAM is a metal-ferroelectric-metal-insulator-semiconductor field-effect transistor (MFMIS-FET) in which the bottom electrode of an MFM structure is coupled to the gate of a FET. The FET gate and the bottom electrode of the MFM structure function as a single floating gate. MFMIS-FET has advantages such as non-destructive read, low write voltage, and high endurance.

It has been determined that in designing an MFMIS-FET it is desirable to make the capacitance of the MFM structure much smaller than that of the FET. Reducing the capacitance of the MFM structure while fixing the capacitance of the FET structure reduces the electric field across the FET insulator while increasing the electric field across the ferroelectric layer. Reducing the electric field across the FET insulator mitigates charge trapping that can adversely affect endurance. Increasing the electric field across the ferroelectric layer reduces the write voltage.

The capacitance of the MFM structure may be reduced relative to that of the FET by reducing the area of the MFM structure. A side effect of reducing the area of the MFM structure is that the overall capacitance of the MFMIS-FET is reduced. The reduction in overall capacitance decreases drain currents, which can limit device performance.

In accordance with some aspects of the present teachings, the problem of reducing the capacitance ratio between the MFM structure and the FET in an MFMIS-FET is solved by implementing the FET with a three-dimensional structure that allows the FET to have an effective area that is greater than the footprint of the FET. In accordance with the present teachings, the MFM structure may have an effective area that is nearly equal to the footprint of the FET structure, whereby a ratio between the effective area of the FET and the footprint of the FET is approximately the same as a ratio between the effective area of the FET and the effective area of the MFM structure. Increasing this ratio reduces charge trapping and reduces write voltages. In some of these teachings, the area ratio is 4 to 1 or greater, which may be sufficient to provide satisfactory endurance. In some of these teachings, the area ratio is 7 to 1 or greater, which provide good endurance. In some of these teachings, the area ratio is 10 to 1 or greater, which provides near optimal performance. In some of these teachings, the effective area of the MFM structure is at least ⅔ the footprint of the FET.

In some of these teachings, the FET of the MFMIS-FET includes a plurality of FET structures each having a channel region that is disjoint from the channel regions of the other FET structures. In some of these teachings, the FET of the an MFMIS-FET is implemented with one or more FinFET structures. In some of these teaching the FET of the MFMIS-FET is implemented with a plurality of FinFET structures. In some of these teaching the FET of the MFMIS-FET is implemented with gate all-around structures such as nanowires or HexaFETs. In some of these teachings, the MFMIS-FET is formed below the first metallization layer.

In some of these teachings, the gate electrode of the FET provides the bottom electrode of the MFM structure. In some of these teachings, a single sidewall spacer surrounds both the MFM structure and the FET. In some of these teachings, the sidewall spacer extends to the top or above the top of the MFM structure. These structures may result from a process in which sidewall spacers formed during a replacement gate process help define and determine a size of the MFM structure.

Figure 2:
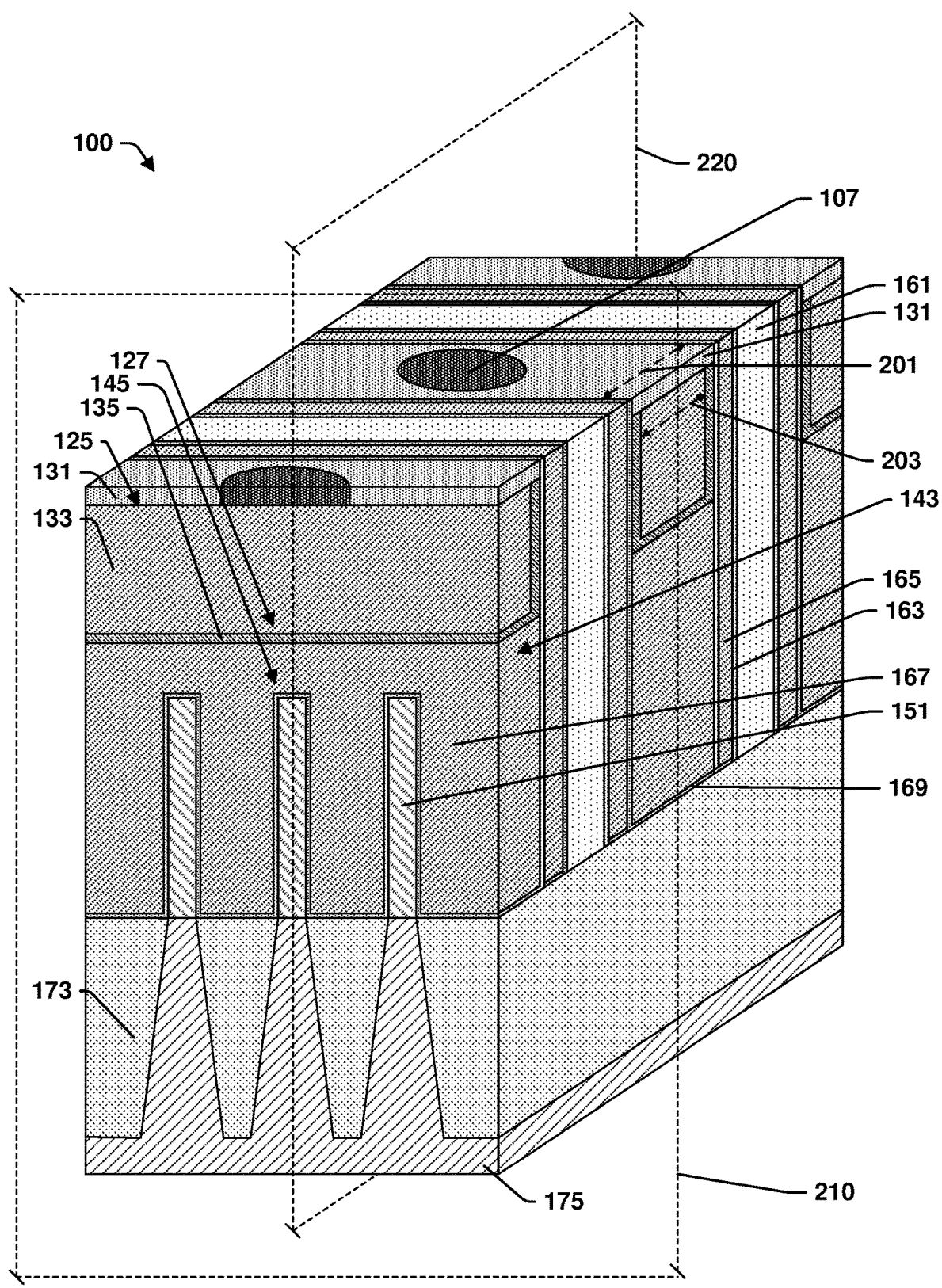
FIG. 2 illustrates a perspective cutaway view of a portion of the IC device of FIG. 1.

FIG. 1 illustrates a portion of an IC device 100 including an MFMIS-FET 125 according to some aspects of the present teachings. FIG. 2 provide a perspective view of another portion of IC device 100 including MFMIS-FET 125. MFMIS-FET 125 includes MFM 127 and FET 143. FET 143 include three FET structures 145 formed around three semiconductor fins 151. Each FET structure 145 includes a distinct channel region 153 within a distinct fin 151 and shares a common gate 167. Each channel region 153 is separated from the common gate 167 by an insulator 169. Common gate 167 also provides a bottom electrode for MFM 127. MFM 127 also include top electrode 133 and a ferroelectric layer 135 between top electrode 133 and common gate 167. Common gate 167 is a floating gate, is a conductive structure, and may include multiple layers of varying composition.

MFMIS-FET 125 is formed over substrate 175. Substrate 175 may be, for example, a bulk substrate (e.g., a bulk silicon substrate), a silicon-on-insulator (SOI) substrate, or any other suitable substrate. Shallow trench isolation (STI) regions 173 or like structures may be formed in substrate 175 to define the height of channel region 153. Wider STI regions 173 may provide isolation between adjacent MFMIS-FETs 125. Fins 151 may be etched from a semiconductor of substrate 175 or may be one or more other semiconductors grown on substrate 175.

A metal interconnect structure 191 is formed over MFMIS-FET 125. Metal interconnect structure 191 is the product of back-end-of-line (BEOL) processing and includes etch stop layers 131, 109, metallization layers 101, 111, 121 having metal features 103 and vias 107 connecting metal features 103 in adjacent metallization layers 101, 111, 121. Although only three metallization layers 101, 111, 121 are shown, metal interconnect structure 191 may have any number of metal interconnect layers and typically includes more than three. Metal features 103 and vias 107 may be, for example, copper (Cu), tungsten (W), ruthenium (Ru), palladium (Pd), platinum (Pt), cobalt (Co), nickel (Ni), zirconium (Zi), titanium (Ti), tantalum (Ta), aluminum (Al), conductive carbides, oxides, alloys of these metals, or the like. Metal features 103 and vias 107 may be surrounded by a matrix of interlevel dielectric 105. Etch stop layers 109, 131 may include one or more layers of silicon nitride (SiN), silicon carbide (SiC), silicon carbonitride (SiCN), silicon oxycarbide (SIOC), silicon oxycarbonitiride (SiOCN), combinations thereof, or the like.

Interlevel dielectric 105 may be one or more low-κ dielectrics or extremely low-κ dielectrics. A low-k dielectric is a material having a smaller dielectric constant than $SiO_2$. $SiO_2$ has a dielectric constant of about 3.9. Examples of low-k dielectrics include organosilicate glasses (OSG) such as carbon-doped silicon dioxide, fluorine-doped silicon dioxide (otherwise referred to as fluorinated silica glass (FSG), organic polymer low-k dielectrics, and porous silicate glass. An extremely low-k dielectric is a material having a dielectric constant of about 2.1 or less. An extremely low-k dielectric material is generally a low-k dielectric material formed into a porous structure. Porosity reduces the effective dielectric constant.

MFMIS-FET 125 is surrounded by sidewall spacer 165. In some embodiments, sidewall spacer 165 borders sidewalls of both FET 143 and MFM 127. In some embodiments, sidewall spacers 165 rise to the height of (top of) MFM 127 or higher. In some embodiments, ferroelectric layer 135 rises to the height of top electrode 133. In some embodiments, ferroelectric layer 135 rises to the height of adjacent sidewall spacer 165 and may be separated from sidewall spacer 165 by an extension of insulator 169. These structures relate to formation of MFMs 127 within a space defined by dummy gates in a replacement gate process used to form FETs 143. Adjacent sidewall spacers 165 may be separated by one or more dielectric layers such as a contact etch stop layer (CESL) 163 and an interlevel dielectric layer (ILD0) 161. In some embodiments, ILD0 161 is a low-k dielectric or an extremely low-k dielectric.

MFMIS-FET 125 may have a width 123, a length 201, and a footprint that is the product of width 123 and length 201. The footprint is the two-dimensional area over substrate 175 occupied by a device. FET 143 and MFM 127 each have approximately the same footprint as MFMIS-FET 125, although some variation may occur as a result of slope in sidewalls of sidewall spacer 165. In some embodiments, the width 123 is in the range from 5 to 100 nm. In some embodiments, the width 123 is in the range from 10 to 60 nm. In some embodiments, the length 201 is in the range from 5 to 30 nm. In some embodiments, the length 201 is in the range from 10 to 20 nm.

MFM 127 has an effective area related to capacitance that is nearly the same as its footprint. Effective area related to capacitance may be determined from the formula:

$$A = \frac{C * d}{\varepsilon_0}$$

where A is the effective area, C is the capacitance, d is the thickness of the dielectric (ferroelectric layer 135 in the case of MFM 127 and insulator 169 in the case of FET 143), and $\varepsilon_0$ is the dielectric constant of dielectric or the effective dielectric constant if the dielectric is a multi-layer composite. The effective area of MFM 127 is approximately the length 203 of top electrode 133 time the width 139 of top electrode 133. The length 203 is approximately the length 201 less two times the thickness of ferroelectric layer 135. The width 139 is approximately the width 123 less two times the thickness of ferroelectric layer 135.

FET 143 has an effective area related to capacitance that is greater than its footprint or the effective area of MFM 127. FET 143 has a length 201 that is nearly equal to the length 203 of FET 143, but the effective area of FET 143 per unit length is much greater than that of MFM 127 because it includes contributions from the sides and tops of each of the fins 151. The effective area per unit length of MFM 127 is proportional to just the width 139. The ratio R of the effective area of FET 143, $A_{FET}$, to the effective area of MFM 127, $A_{MFM}$, is therefore approximately:

$$R = \frac{A_{FET}}{A_{MFM}} = \frac{N_F(W_F + 2H_F)}{W_M}$$

wherein $N_F$ is the number of fins 151, $W_F$ is the fin width 147, $H_F$ is the fin height 149, and $W_M$ is the width 139 of MFM 127. For example, if the fin width 147 is 5 nm, the fin height 149 is 50 nm, the width 139 is 45 nm, and there are three fins 151 the area ratio is 7 to 1. In some embodiments, the fin width 147 is in the range from 1 nm to 20 nm. In some embodiments, the fin width 147 is in the range from 2 nm to 10 nm. In some embodiments, the fin height 149 is in the range from 10 nm to 150 nm. In some embodiments, the fin height 149 is in the range from 20 nm to 100 nm. These parameters may be varied to provide a desired area ratio.

In accordance with the present teachings, the effective area of the MFM 127 is relatively large. Its effective area is nearly equal to the footprint of FET 143, which is essentially the same as the footprint of the entire MFMIS-FET 325. Keeping the effective area of the MFM 127 relatively large prevents drain currents from limiting device performance. Although the effective area of the MFM 127 is relatively large, it is much less that the effective area of the FET 143. The effective area of FET 143 is increased with structures such as fins, nanowires, and hexaFETS. In some embodiments the effective area is further increased by using a multiplicity of these structures within each MFMIS-FET 325. The desired ratio between capacitance of FET 143 and capacitance and MFM 127 is achieved by increasing the effective area of FET 143 with three-dimensional FET structures 145 while the effective area of MFM 127 is maintained.

Figure 3:
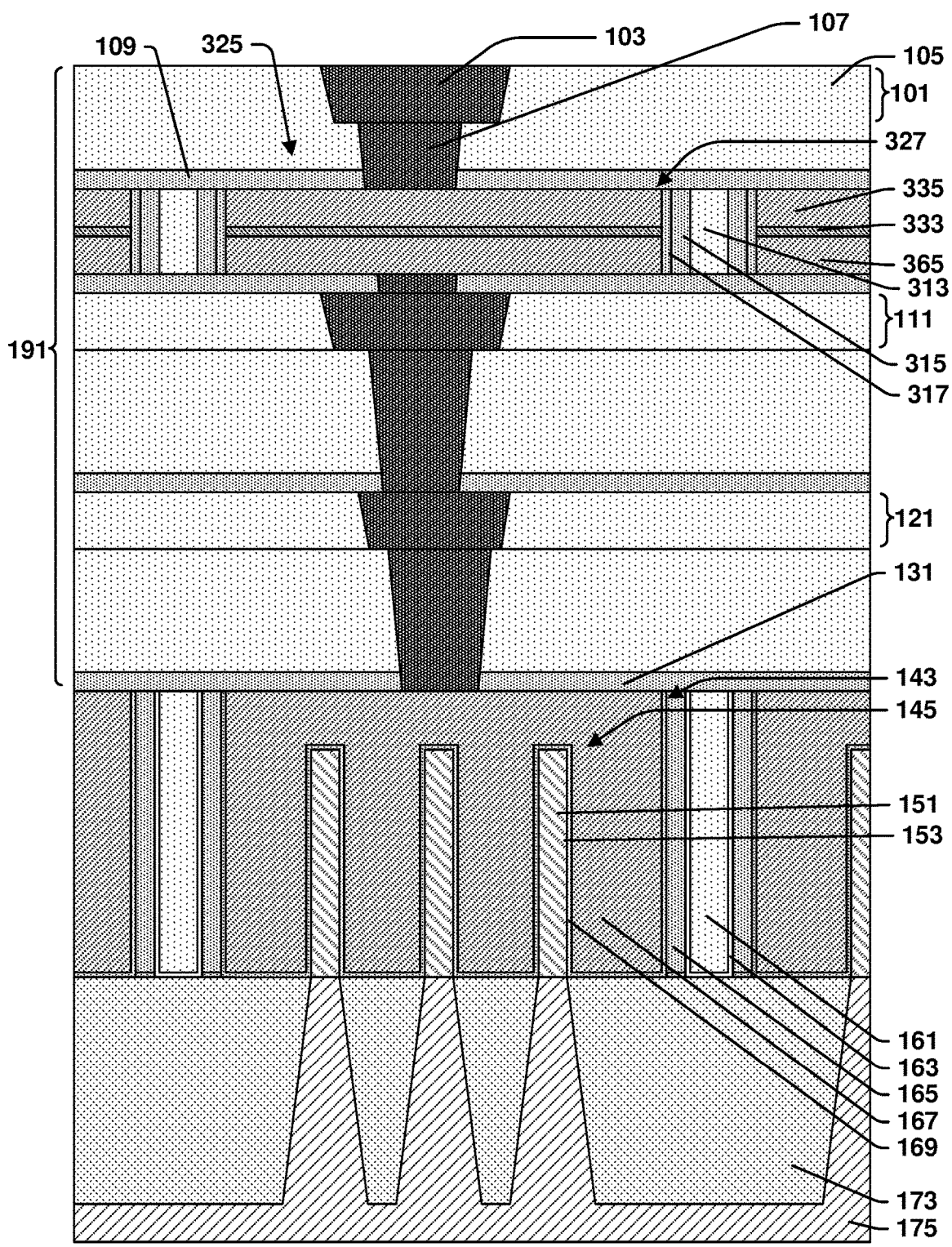
FIG. 3 illustrates a cross-sectional view of an integrated circuit (IC) device with MFMIS-FETs according to some other aspects of the present teachings.

FIG. 3 illustrates an IC device 300 that is like IC device 100 except that IC device 300 has MFMIS-FET 325 that differs from MFMIS-FET 125 in that instead of having an MFM 127 formed immediately above FET 143, MFMIS-FET 325 has MFM 327 that is separated from FET 143 by one or more metallization layers such as metallization layers 111 and 121. Although MFM 327 is shown between the second metallization layer 111 and the third metallization layer 101, MFM 327 could be between any pair of adjacent metallization layers in metal interconnect structure 191.

MFM 327 includes top electrode 335, ferroelectric layer 333, and bottom electrode layer 365. Top electrode 335 and ferroelectric layer 333 may be similar in thicknesses and composition to top electrode 133 and ferroelectric layer 135 of MFM 127. MFM 327 may be flanked by first sidewall spacers 317 and second sidewall spacers 315. Adjacent MFMs 327 are further separated by dielectric 313. First sidewall spacers 317, second sidewall spacers 315, and dielectric layer 313 may be one or more layers of suitable dielectrics such as silicon dioxide ($SiO_2$), silicon nitride (SiN), silicon carbide (SiC), silicon carbonitride (SiCN), silicon oxycarbide (SIOC), silicon oxycarbonitiride (SiOCN), or the like.

Figure 4:
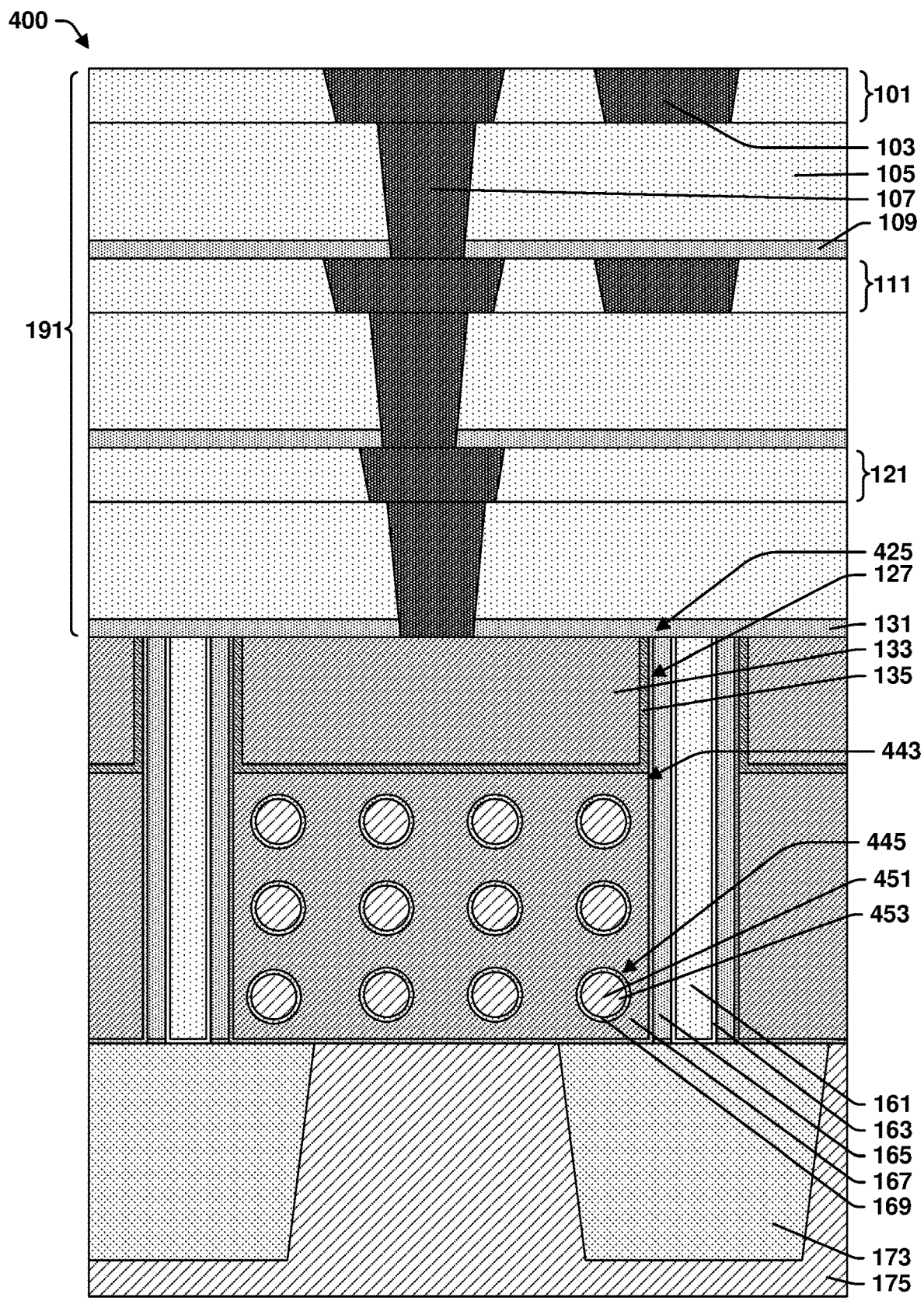
FIG. 4 illustrates a cross-sectional view of an integrated circuit (IC) device with MFMIS-FETs according to some other aspects of the present teachings.

FIG. 4 illustrates an IC device 400 that is like IC device 100 except that IC device 400 includes MFMIS-FETs 425 that are like MFMIS-FETs 125 except that they use FETs 443 in place of FETs 143. FETs 443 include an array of nanowire FET structures 445 each including a channel region 453 provided by a semiconductor nanowire 451, an insulator 469 surrounding the nanowire 451 and separating nanowire 451 from common gate 167. The nanowires 451 are disjoint.

Figure 5:
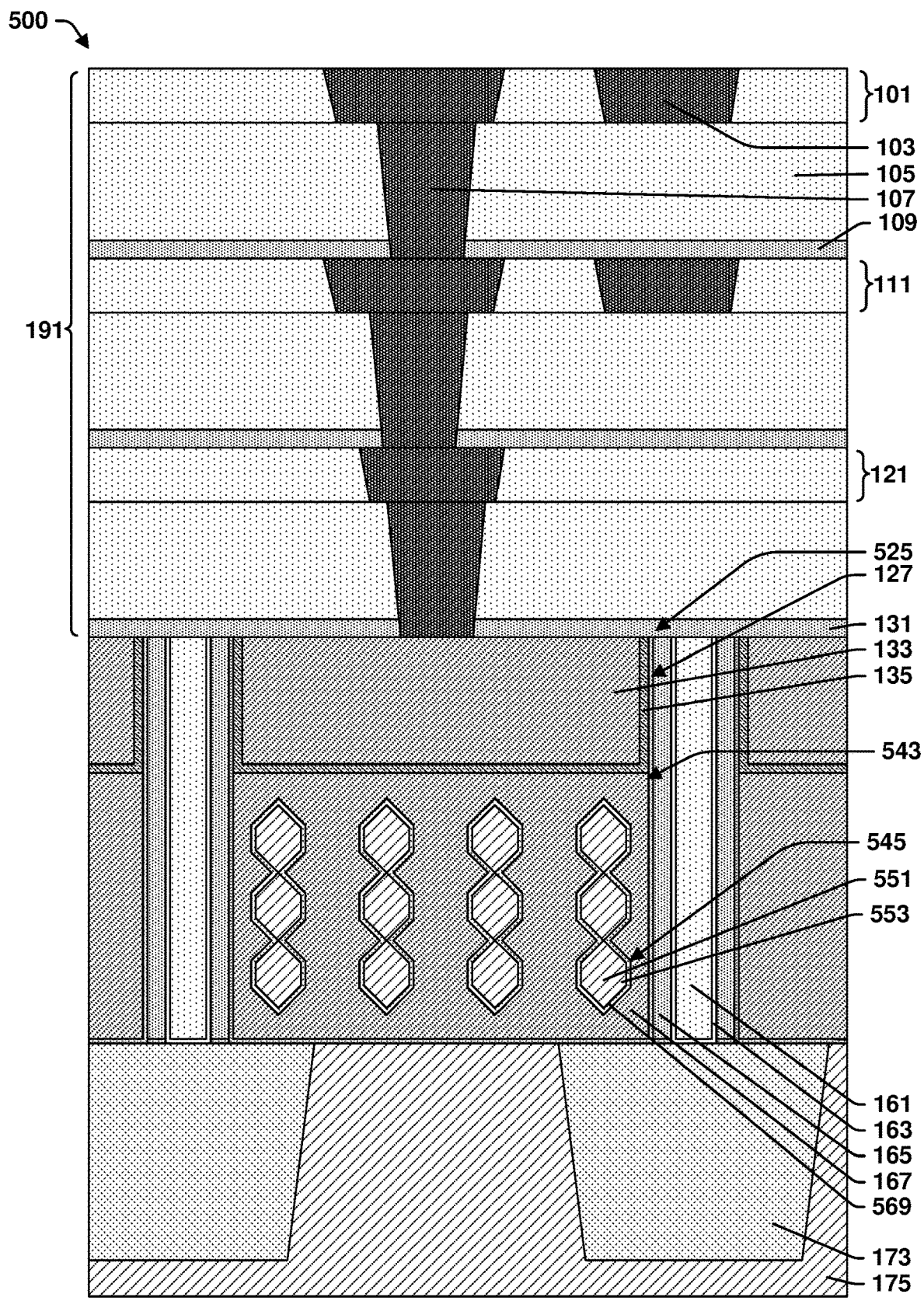
FIG. 5 illustrates a cross-sectional view of an integrated circuit (IC) device with MFMIS-FETs according to some other aspects of the present teachings.

FIG. 5 illustrates an IC device 500 that is like IC device 400 except that IC device 500 includes MFMIS-FETs 525 that are like MFMIS-FETs 425 except that they use FETs 543 in place of FETs 443. FETs 543 include an array of HexaFETs 545 each including a hexagonal semiconductor structure 551 providing a channel region 553 surrounded by insulator 569 and sharing common gate 167. FET 443 and FET 543 provide examples of gate-all-around structure. They are also examples in which a given channel cross-sectional area can be divided into many small and disjoint parts. Both of these attributes contribute to increasing the area ratio R and can facilitate achieving a desired area ratio such as an area ratio of 10 to 1 or more.

FIGS. 6-47 provide a series of cross-sectional views 600-4700 that illustrate an integrated circuit device according to the present teachings at various stages of manufacture according to a process of the present teachings. With reference to FIG. 2, the even-numbered of these figures correspond to the cross-section 210 which is perpendicular to fins 151 midway along the length 201. The odd-numbered of these figures correspond to the cross-section 220 which runs through the middle of a fin 151. Although FIGS. 6-47 are described in relation to a series of acts, it will be appreciated that the order of the acts may in some cases be altered and that this series of acts are applicable to structures other than the ones illustrated. In some embodiments, some of these acts may be omitted in whole or in part. Furthermore, it will be appreciated that the structures shown in FIGS. 6-47 are not limited to a method of manufacture but rather may stand alone as structures separate from the method.

Figure 6:
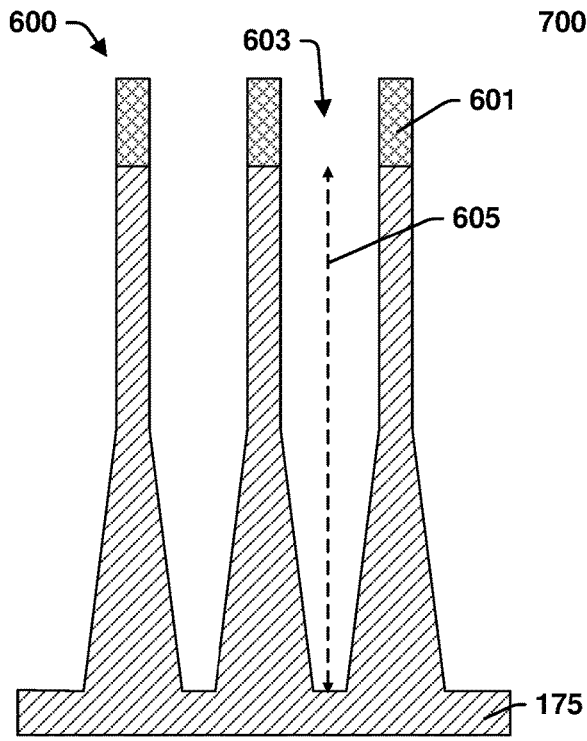
Figure 7:
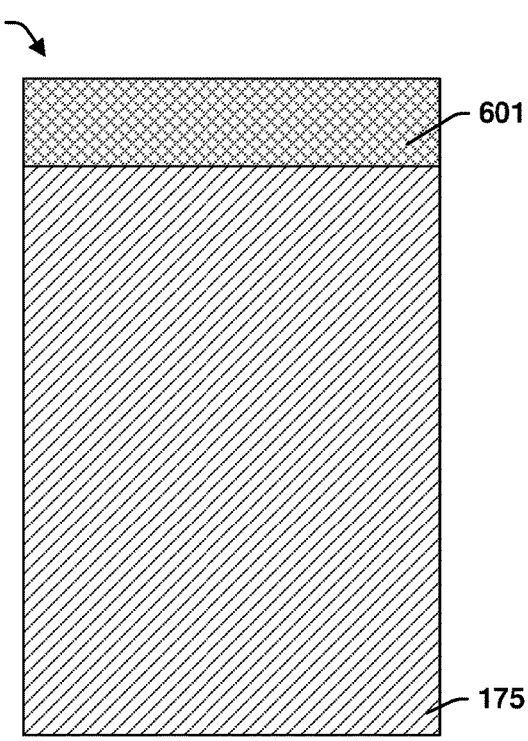

As illustrated by the cross-sectional view 600 of FIG. 6 and the cross-sectional view 700 of FIG. 7, the process begins by forming a photoresist mask 601 and using it to pattern trenches 603 in substrate 175. In some embodiments, the depth 605 of trenches 603 is in the range from 20 nm to 300 nm. In some embodiments, the depth 605 is in the range from 40 nm to 200 nm. As illustrated by the cross-sectional views 800 and 900 of FIGS. 8 and 9, photoresist mask 601 may be stripped and trenches 603 filled with dielectric to form STI regions 173. The dielectric may be silicon dioxide ($SiO_2$) or the like.

Figures 10, 11:
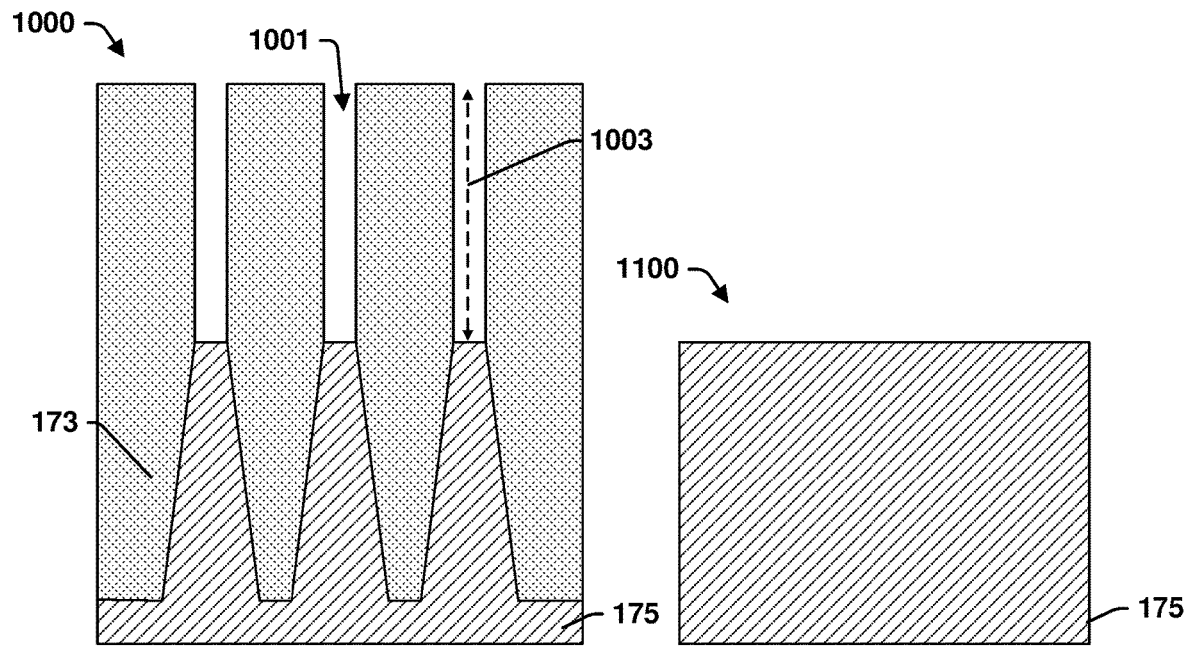

As illustrated by the cross-sectional views 1000 and 1100 of FIGS. 10 and 11, an etch process may be carried out to recess the semiconductor between STI regions 173 to form trenches 1001. In some embodiments, the depth 1003 of trenches 1001 is in the range from 10 nm to 150 nm. In some embodiments, the depth 1003 is in the range from 20 nm to 100 nm.

Figures 12, 13:
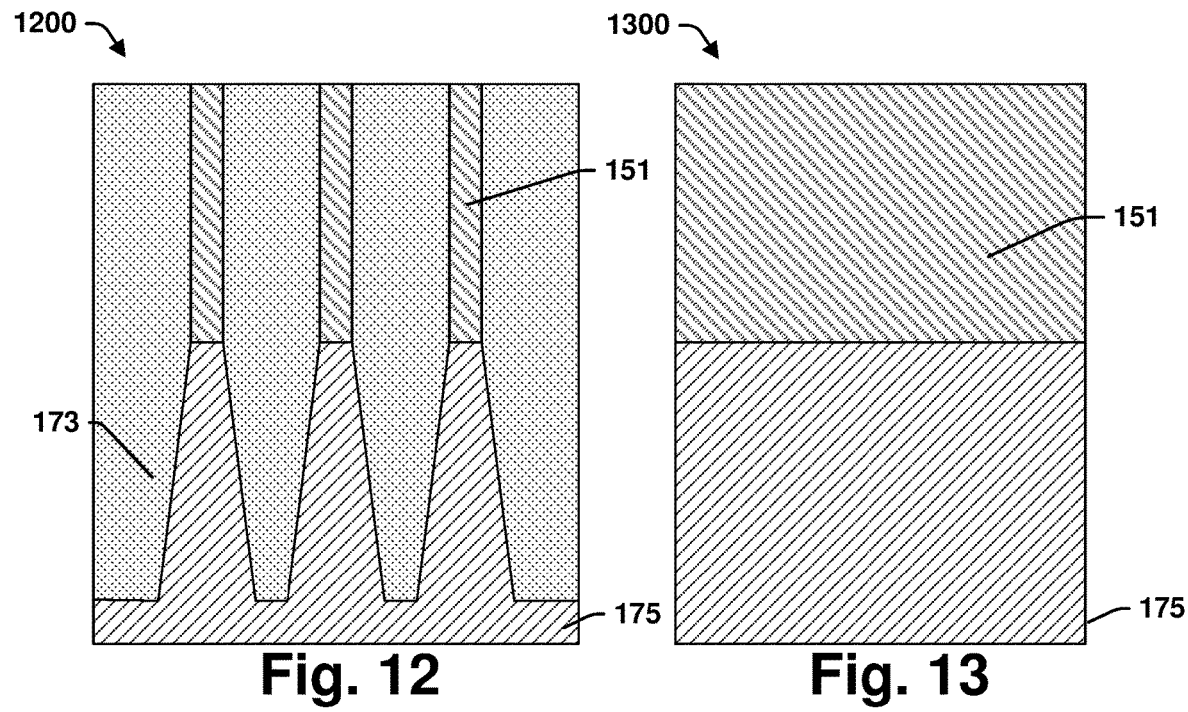

As illustrated by the cross-sectional views 1200 and 1300 of FIGS. 12 and 13, semiconductor may be deposited or grown to fill trenches 1001 and form fins 151. Fins 151 may comprise multiple layers of one or more semiconductors. Semiconductors suitable for fins 151 may include one or more of Si, SiGe, Ge, InP, InGaAs, InAs, GaSb, or the like. Fins 151 may be formed by an epitaxial growth process. More generally, fins 151 may be formed by any suitable process including processes having steps different from the ones illustrated by the cross-sectional views 600 to 1300 of FIGS. 6 to 13.

Figure 14:
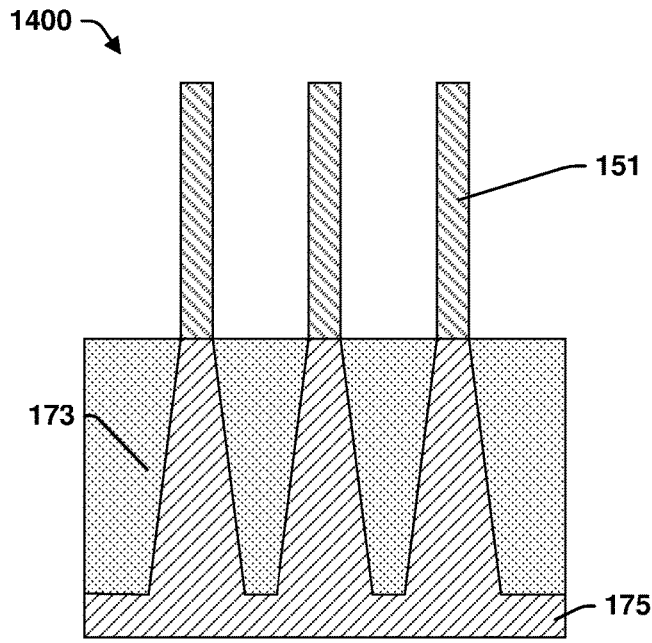
Figure 15:
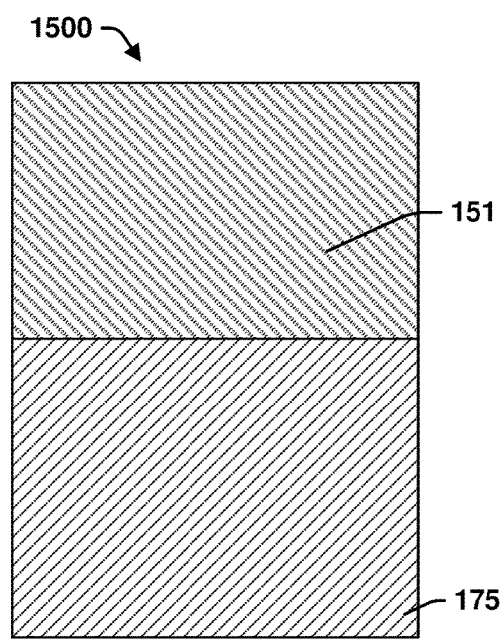
Figure 16:
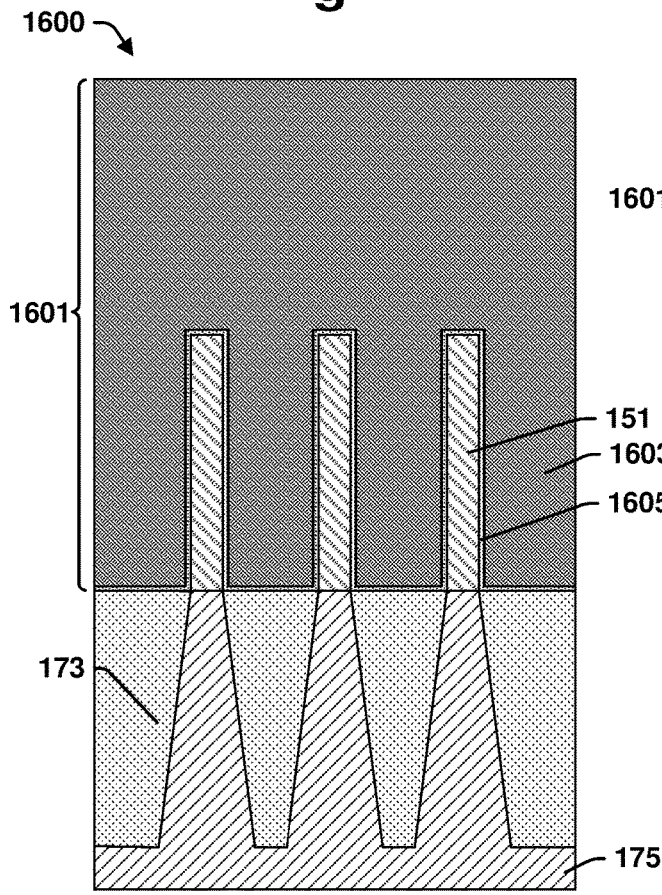
Figure 17:
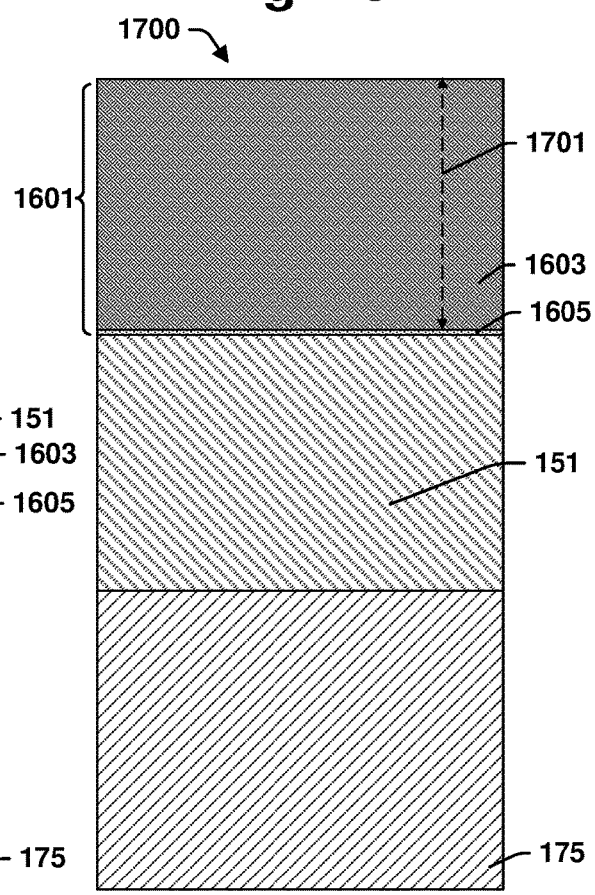

As illustrated by the cross-sectional views 1400 and 1500 of FIGS. 14 and 15, an etch process may be carried out to recess STI regions 173 around fins 151. As illustrated by the cross-sectional views 1600 and 1700 of FIGS. 16 and 17, a dummy gate stack 1601 may then be formed over fins 151. Dummy gate stack 1601 include dielectric layer 1605 and dummy gate layer 1603. Dielectric layer 1605 may be a deposited layer such as silicon dioxide ($SiO_2$) or the like formed by chemical vapor deposition (CVD), physical vapor deposition (PVD), atomic layer deposition (ALD), or the like. Alternatively, dielectric layer 1605 may be grown by oxidizing a thin layer at the surface of fins 151. Dummy gate layer 1603 may be polysilicon or the like formed by chemical vapor deposition (CVD) or the like. In some embodiments, the thickness 1701 of dummy gate layer 1603 over fins 151 is in the range from 10 nm to 300 nm. In some embodiments, thickness 1701 is in the range from 20 nm to 100 nm.

As illustrated by the cross-sectional views 1800 and 190 of FIGS. 18 and 19, a photoresist mask 1801 may be formed and used to pattern dummy gate layer 1603 to form dummy gates 1803. Dummy gate layer 1603 may be patterned using any suitable etch process, for example, dry etching such as plasma etching or the like. Dummy gates 1803 are shown having vertical sidewalls, but their sidewalls may have a gradual slope. In some embodiments, the slope is within 20° of vertical.

As illustrated by the cross-sectional views 2000 and 2100 of FIGS. 20 and 21, spacers 165 may be formed around dummy gates 1803. Spacers 165 are formed by depositing a layer of spacer material over the structure illustrated by cross-sectional views 1800 and 1900 of FIGS. 18 and 19 (after stripping photoresist mask 1801) followed by an anisotropic etch process that leaves spacer material only on the sides of dummy gates 1803. Materials that may be suitable for spacers 165 include, without limitation, silicon nitride (SiN), silicon carbide (SiC), silicon carbonitride (SiCN), silicon oxycarbide (SIOC), silicon oxycarbonitiride (SiOCN), and the like. A suitable process may be chemical vapor deposition (CVD), physical vapor deposition (PVD), atomic layer deposition (ALD), or the like. A suitable etch process may be a dry etch process such as plasma etching or the like. Spacers 165 are shown having uniform thickness and sharply vertical sidewalls for ease of illustration but may in fact taper slightly and narrow near the tops of dummy gates 1803.

As illustrated by the cross-sectional views 2200 and 2300 of FIGS. 22 and 23, areas of fins 151 not covered by dummy gates 1803 are doped to form source/drain regions 2301. Some of the doping may take place before forming spacers 165 and some of the doping may take place after forming spacers 165. Dielectric layer 1605 may be removed in the area between dummy gates 180 or between spacers 165 prior to doping. Alternatively, or in addition, an epitaxial growth process may be used to form and/or expand source/drain regions 2301. In some embodiments, epitaxial growth causes source/drain regions 2301 on adjacent fins 151 of FET 143 to merge. An annealing process may be carried out for source/drain regions 2301 prior to replacing dummy gates 1803.

Figure 24:
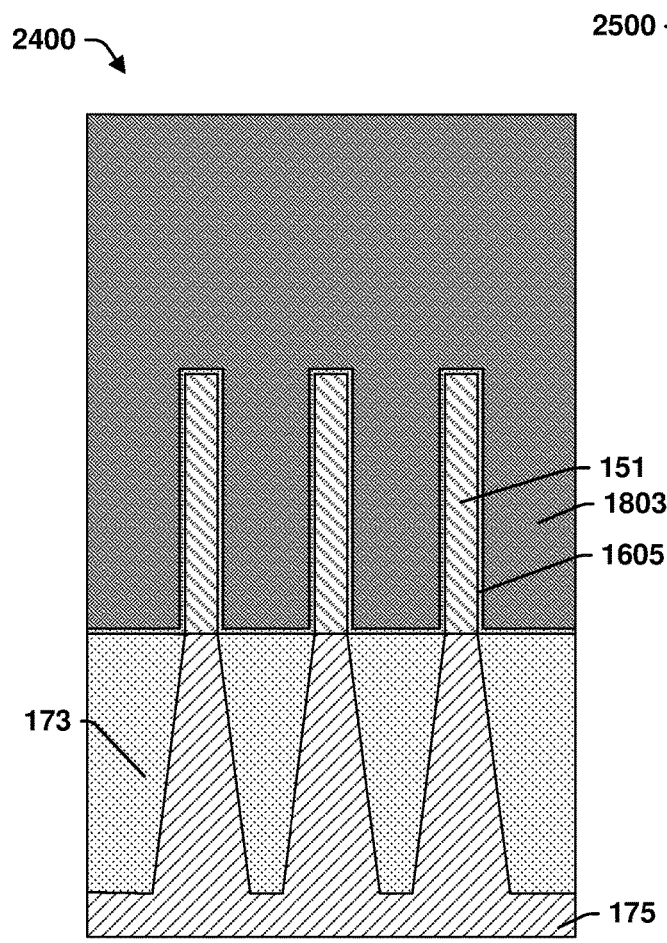
Figure 25:
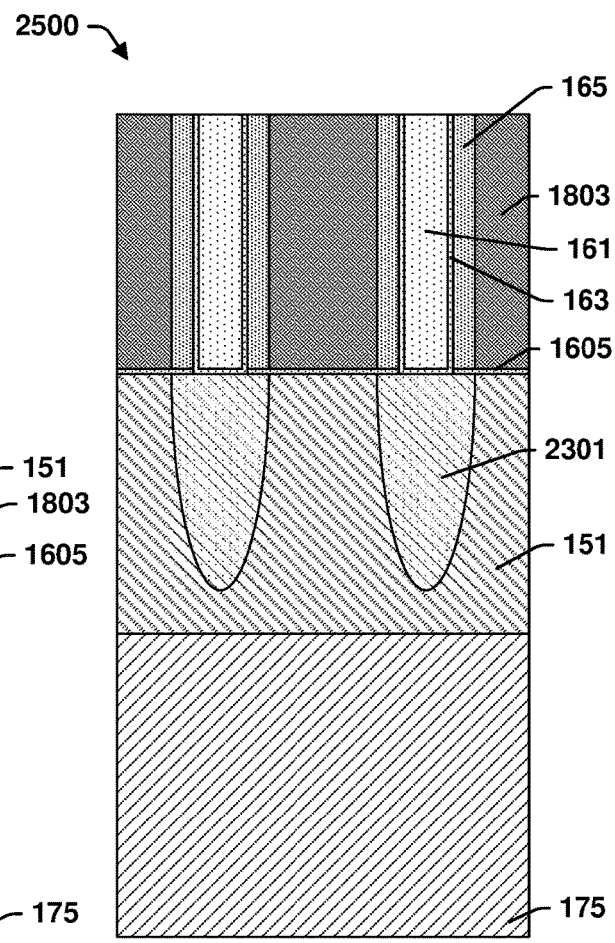

As illustrated by the cross-sectional views 2400 and 2500 of FIGS. 24 and 25, CESL 163 may be formed followed by deposition of ILD0 161 and planarization to remove these materials from the tops of dummy gates 1803. CESL 163 may be, for example, silicon dioxide ($SiO_2$), silicon nitride ($Si_3N_4$), silicon oxynitride (SiON), silicon oxycarbide (SiOC), or the like and may be deposited by may be chemical vapor deposition (CVD), physical vapor deposition (PVD), atomic layer deposition (ALD), or the like. ILD0 161 may be a low-κ dielectric, an extremely low-κ dielectric, or any other dielectric. ILD0 161 may be formed by chemical vapor deposition (CVD), physical vapor deposition (PVD), or any other suitable process. Planarization may be by chemical mechanical polishing (CMP) or any other suitable planarization process.

Figure 26:
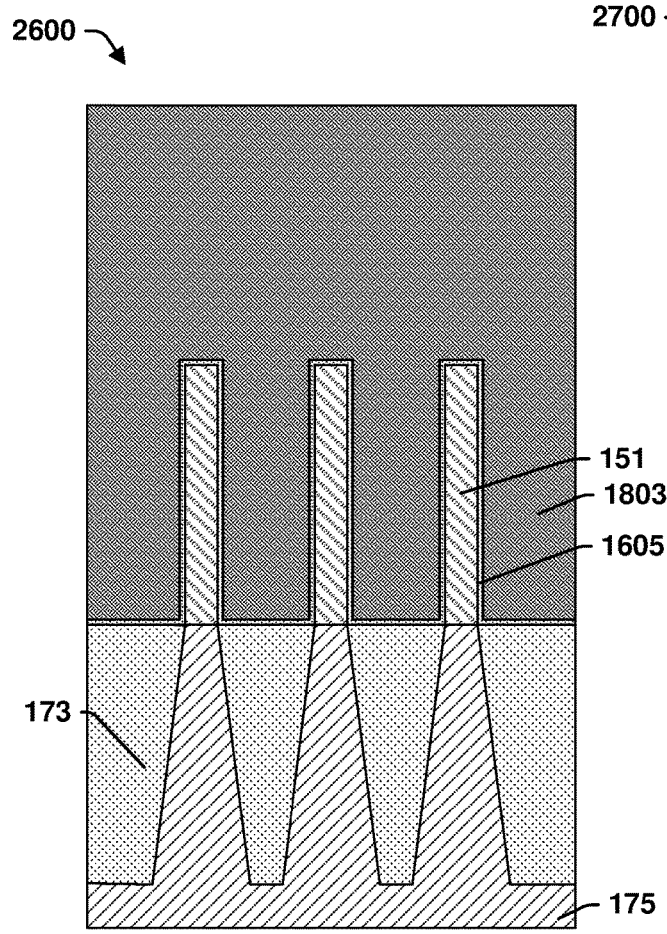
Figure 27:
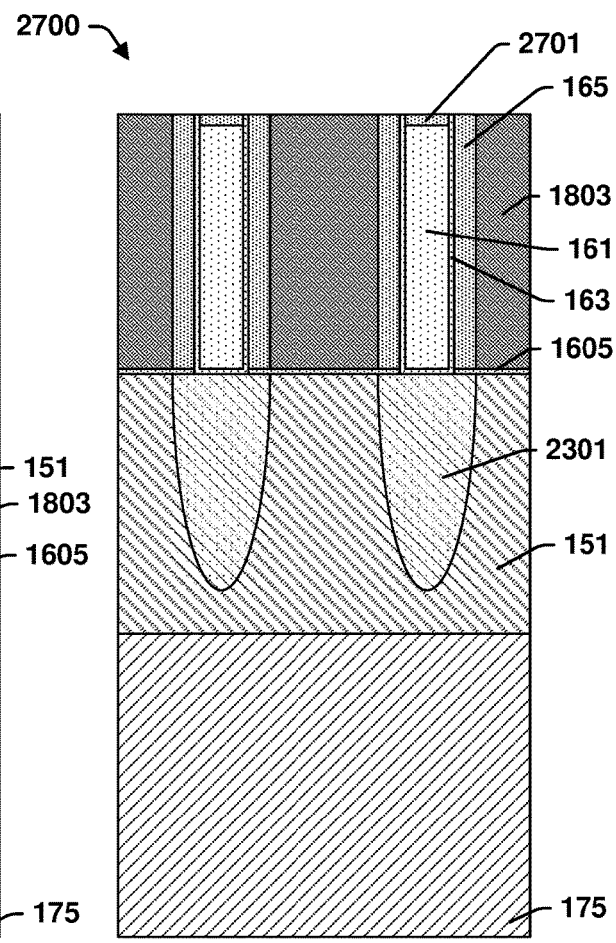

As illustrated by the cross-sectional views 2600 and 2700 of FIGS. 26 and 27, an etch stop layer 2701 may be formed over ILD0 161 between dummy gates 1803. Forming etch stop layer 2701 may include etching to recess ILD0 161 between dummy gates 1803, depositing a layer of the etch stop material, and planarizing to remove the etch stop material over dummy gates 1803. The recessing process may be a dry etch, a wet etch, or the like. The etch stop material may be silicon nitride ($Si_3N_4$) or the like and may be deposited by may be chemical vapor deposition (CVD), physical vapor deposition (PVD), atomic layer deposition (ALD), or the like. The planarization process may be CMP or the like.

As illustrated by the cross-sectional views 2800 and 2900 of FIGS. 28 and 29, a process may then be carried out to remove dummy gates 1803. The process may also remove dielectric layer 1605. The removal process may be a dry etch, a wet etch, a combination thereof, or the like.

As illustrated by the cross-sectional views 3000 and 3100 of FIGS. 30 and 31, replacement gates may then be formed. Forming the replacement gates includes depositing insulator 169 and common gate 167. Insulator 169 may include multiple layers. In some embodiments, at least one of those layers is a high-κ dielectric. For example, insulator 169 may include high-κ dielectric layer separated from fins 151 by an interfacial dielectric layer. The interfacial layer may be silicon dioxide ($SiO_2$), silicon oxynitride (SiON), or the like. The interfacial layer may form by oxidation of fins 151, by deposition, or as a result of interaction between the high-k dielectric and the semiconductor of fins 151. The interfacial layer may be very thin to minimize the interfacial layer's contribution to the overall equivalent oxide thickness of the resulting gates. The thickness may be in the range from 1 to 20 Angstroms, for example A high-k dielectric is a dielectric having a higher dielectric constant than silicon dioxide ($SiO_2$). Examples of high-k dielectrics include hafnium-based materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium oxide aluminum oxide ($HfO_2$—$Al_2O_3$) alloy, and the like. Additional examples of high-k dielectrics include, without limitation, zirconium oxide ($ZrO_2$), tantalum oxide ($Ta_2O_5$), aluminum oxide ($Al_2O_3$), yttrium oxide ($Y_2O_3$), lanthanum oxide ($La_2O_3$), strontium titanium oxide ($SrTiO_3$), and the like. The high-k dielectric layer may have a thickness in the range from 5 to 50 Angstroms, for example. The high-k dielectric layer may be formed by any suitable process. Examples of processes that may be suitable, without limitation, chemical vapor deposition (CVD), atomic layer deposition (ALD), and the like.

Common gate 167 may include multiple layers of differing compositions. Different metals can be used for different regions of substrate 175. One or more of the layers may be a work function metal. Examples of work function metals include, without limitation, titanium (Ti), titanium nitride (TiN), tantalum nitride (TaN), tantalum (Ta), tantalum carbide (TaC), tantalum nitride (TaN), tantalum silicon nitride (TaSiN), tungsten nitride (WN), molybdenum nitride (MoN), molybdenum oxynitride (MoON), and the like. Additional metal layers may include, without limitation, tungsten (W), ruthenium (Ru), palladium (Pd), platinum (Pt), cobalt (Co), nickel (Ni), zirconium (Zi), titanium (Ti), tantalum (Ta), aluminum (Al), conductive carbides, oxides, and alloys of these metals, and the like. The metal layers may be formed by any suitable process or combination of processes. Physical vapor deposition (PVD) is a typical process. Examples of other metal layer formation process that may be suitable include electroplating, electroless plating, ALD, and CVD. Planarization, by CMP for example, to remove materials above the height of etch stop layer 2701 leaves the structure shown by the cross-sectional views 3000 and 3100 of FIGS. 30 and 31. The structure includes FETs 143 each having three FET structures 145.

The cross-sectional views 3200 and 3300 of FIGS. 32 and 33 on the one hand and the cross-sectional views 3400 and 3500 of FIGS. 34 and 35 on the other hand provide two examples for the structure of common gate 167, the first being characterized by thick work function metal 3201 and the second being characterized by thin work function metal 3201. The work function metal 3201 may be, for example, titanium nitride (TiN) or the like. The other metal 3401 may be tungsten (W) or the like. Thick work function metal 3201 may completely fill the space between fins 151. Thick work function metal 3201 does not. Thick work function metal 3201 may completely fill the space between spacers 165 or some room may be left for a layer of the other metal 3401. The thickness of work function metal 3201 may be used to vary a threshold voltage.

As illustrated by the cross-sectional views 3600 and 3700 of FIGS. 36 and 37, a process may be carried out to recess common gate 167 below the height of spacers 165. The process may be a wet etch, a dry etch, or the like. In some embodiments, the depth 3701 is half or more the height of spacers 165 over fins 151. In some embodiments, the depth 3701 is in the range from 10 nm to 150 nm. In some embodiments, the depth 3701 is in the range from 20 nm to 50 nm.

Figure 36:
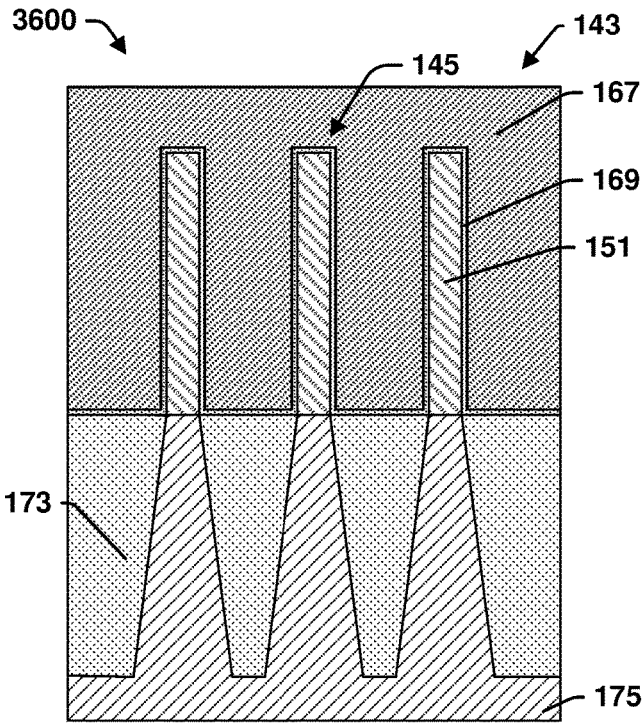
Figure 37:
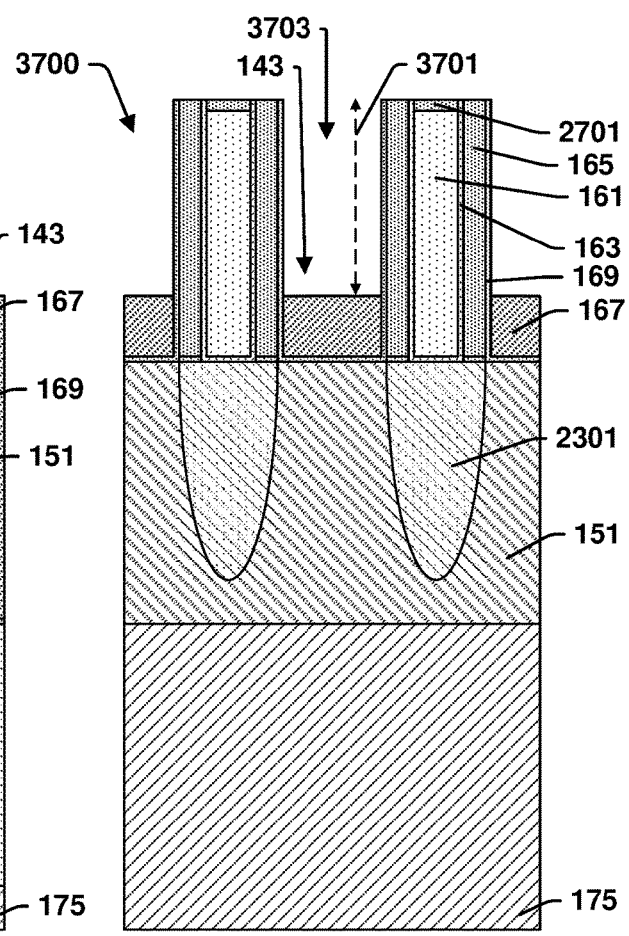
Figures 38, 39:
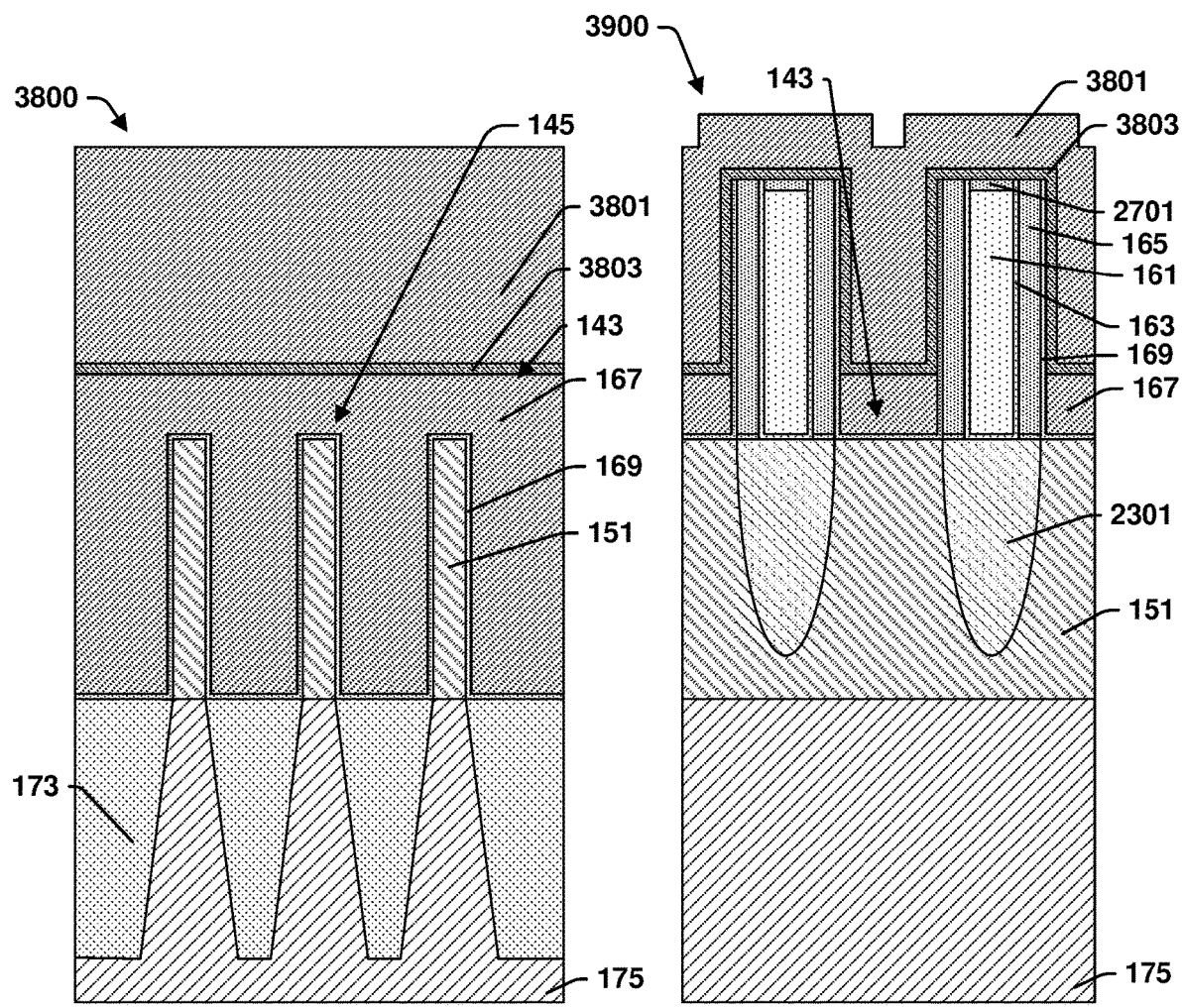

As illustrated by the cross-sectional views 3800 and 3900 of FIGS. 38 and 39, a ferroelectric layer 3803 and a top electrode layer 3801 may be formed over the structure illustrated by the cross-sectional views 3600 and 3700 of FIGS. 36 and 37 to form an MFM cell stack in which common gate 167 provides the bottom electrode layer. The material of ferroelectric layer 3803 may or may not be ferroelectric prior to annealing. If it is not, it will become ferroelectric during subsequent processing. Ferroelectric layer 3803 includes electric dipoles. In some embodiments, the thickness of ferroelectric layer 3803 is in the range from 1 nm to 15 nm. In some embodiments, the thickness of ferroelectric layer 3803 is in the range from 1 nm to 5 nm. Examples of ferroelectric materials include hafnium oxide ($HfO_2$), hafnium silicon oxide (HfSiO), hafnium zirconium oxide (HfZrO), aluminum oxide ($Al_2O_3$), titanium oxide ($TiO_2$), lanthanum oxide ($LaO_x$), $BaSrTiO_x$ (BST), PbZr-$TiO_x$ (PZT), or the like. Some of these materials (such as $HfO_2$, $HfSiO_x$, $HfZrO_x$, $Al_2O_3$, $TiO_2$, and $LaO_x$) include the same elements as some high-k dielectric materials but may differ in the ratios of elements or in crystal structure. The ferroelectric material may be formed using CVD, PVD, ALD or the like.

A top electrode a top electrode layer 3801 includes one or more layers of materials such as tungsten (W), titanium (Ti), tantalum (Ta), silver (Ag), aluminum (Al), nickel (Ni), conductive alloys thereof, or the like. An annealing step may also be carried out for ferroelectric layer 3803. The annealing may be performed using thermal annealing, microwave annealing, laser annealing, or other applicable methods. The annealing temperature may in the range from 200° C. to 600° C. This annealing may be lower in temperature or shorter in duration than the annealing used on source/drain regions 2301, which is typically at least 5 second at 1000° C. The lower annealing temperature or shorter duration may prevent high-κ dielectric in insulator 169 from interacting with metal in common gate 167 in a manner that would alter a threshold voltage.

As illustrated by the cross-sectional views 4000 and 4100 of FIGS. 40 and 41, a planarization process may be carried out to define individual MFMs 127 and MFMIS-FETs 125. The planarization process may be CMP or the like. The process forms individual ferroelectric layers 135 from ferroelectric layer 3803 and individual top electrodes 133 from top electrode layer 3801. Etch stop layer 2701 may help define the endpoint of the planarization process. In some embodiments, the planarization process removes etch stop layer 2701.

Figures 42, 43:
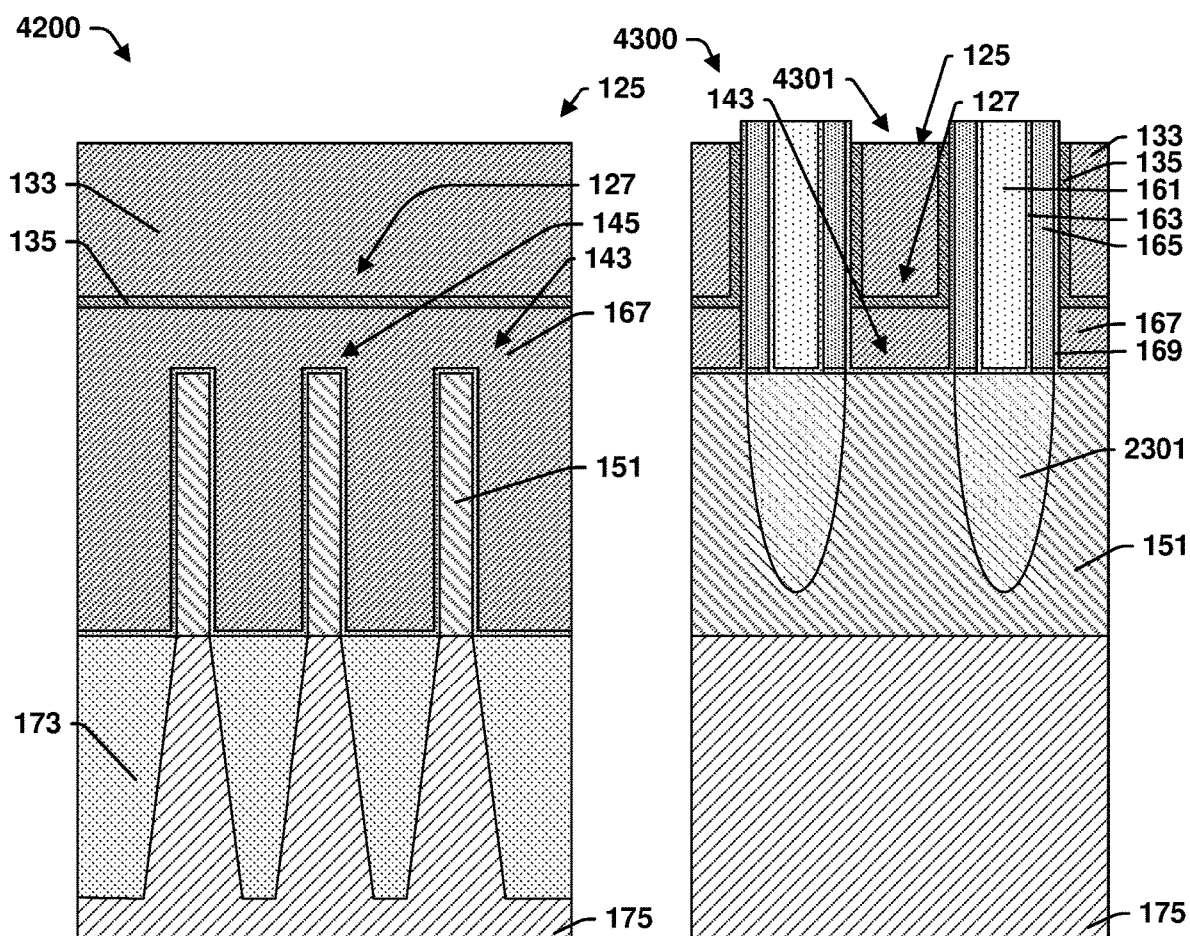

As illustrated by the cross-sectional views 4200 and 4300 of FIGS. 42 and 43, and a process may be carried out to recess MFMs 127 below the height of spacers 165. The process may be a wet etch, a dry etch, or the like. As illustrated by the cross-sectional views 4400 and 4500 of FIGS. 44 and 45, the recesses 4301 created by the recessing process may be filled to produce etch stop layer 131 that covers MFMIS-FETs 125 but not ILD0 161. Filling these recesses 4301 may include depositing etch stop material followed by a planarization process to remove the etch stop material from over ILD0 161. The etch stop material may be silicon nitride ($Si_3N_4$), silicon oxynitride (SiON), or the like. The deposition process may be CVD, ALD, or the like. The planarization process may be CMP or the like.

Figures 44, 45:
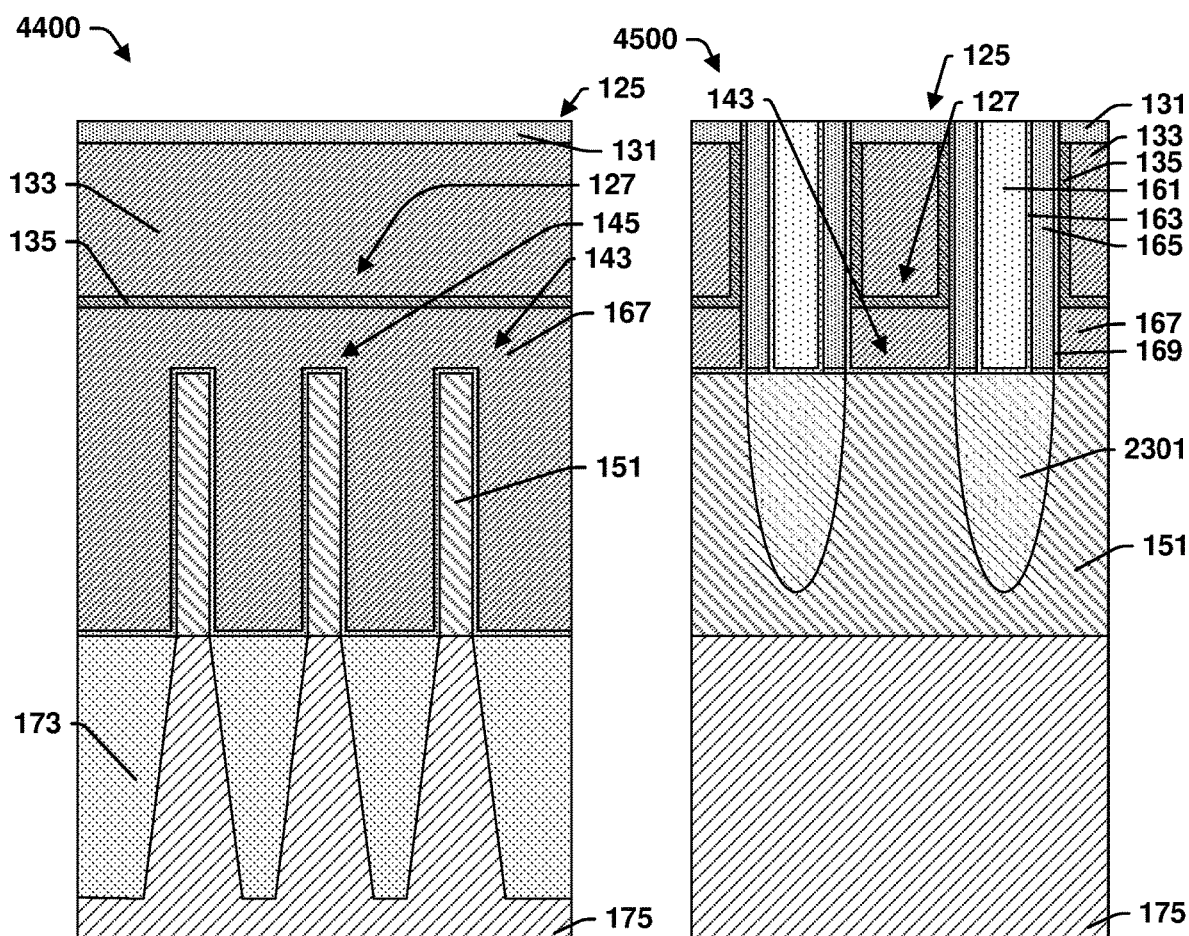
Figures 46, 47:
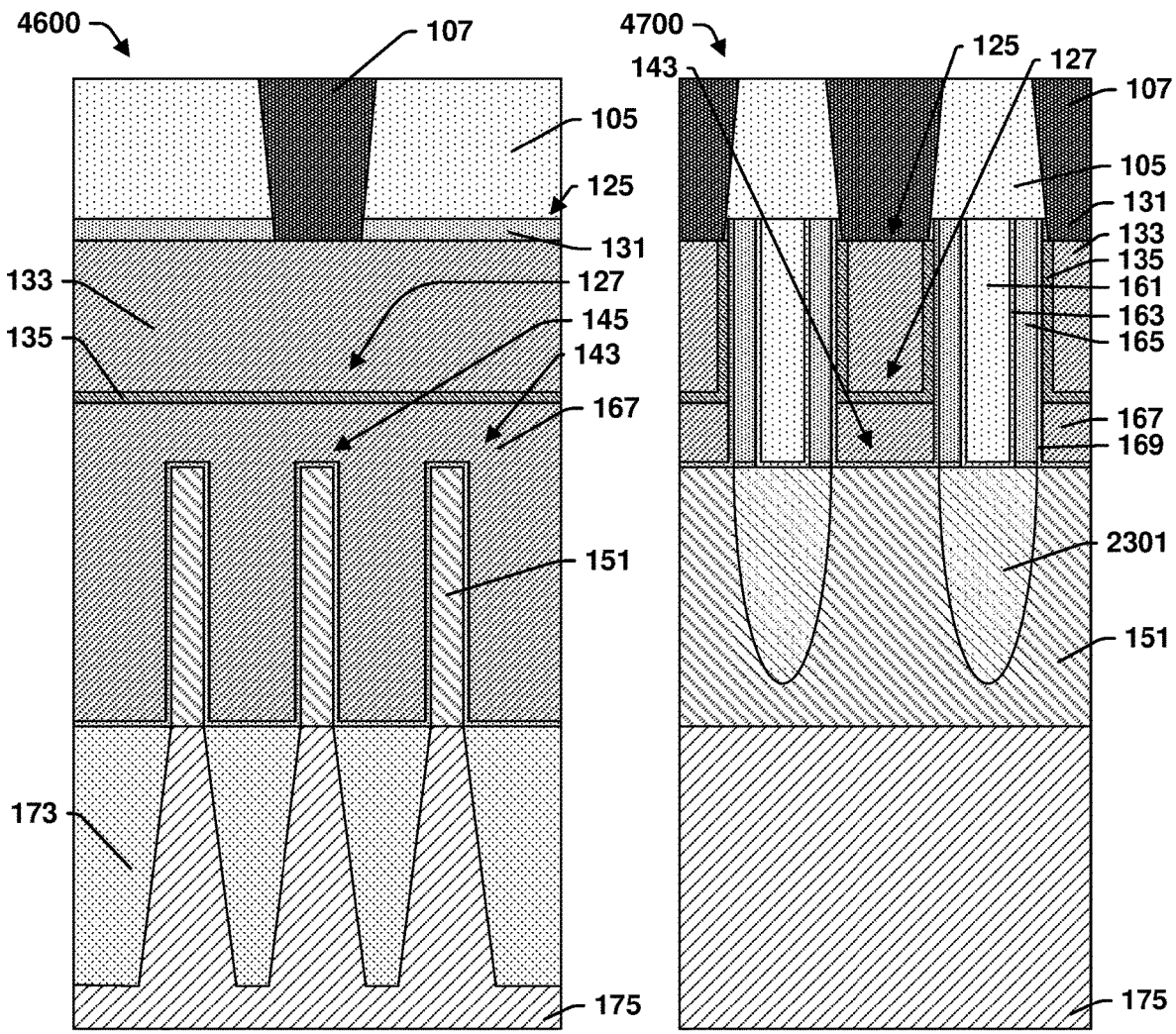

As illustrated by the cross-sectional views 4600 and 4700 of FIGS. 46 and 47, interlevel dielectric 105 may be deposited over the structure illustrated by the cross-sectional views 4400 and 4500 of FIGS. 44 and 45 and vias 107 may be formed through the interlevel dielectric 105 to connect with top electrodes 133. Vias 107 may be formed by etching openings through interlevel dielectric 105, depositing metal, and planarizing to remove excess metal above the interlevel dielectric 105. The resulting structure is also illustrated by FIG. 2. Additional vias (not shown) may be formed at this stage of processing to make contact with source/drain regions 2301. Further processing, which may in may include damascene or dual damascene processes may produce a structure correspond to that of IC 100 of FIG. 1.

Figure 48:
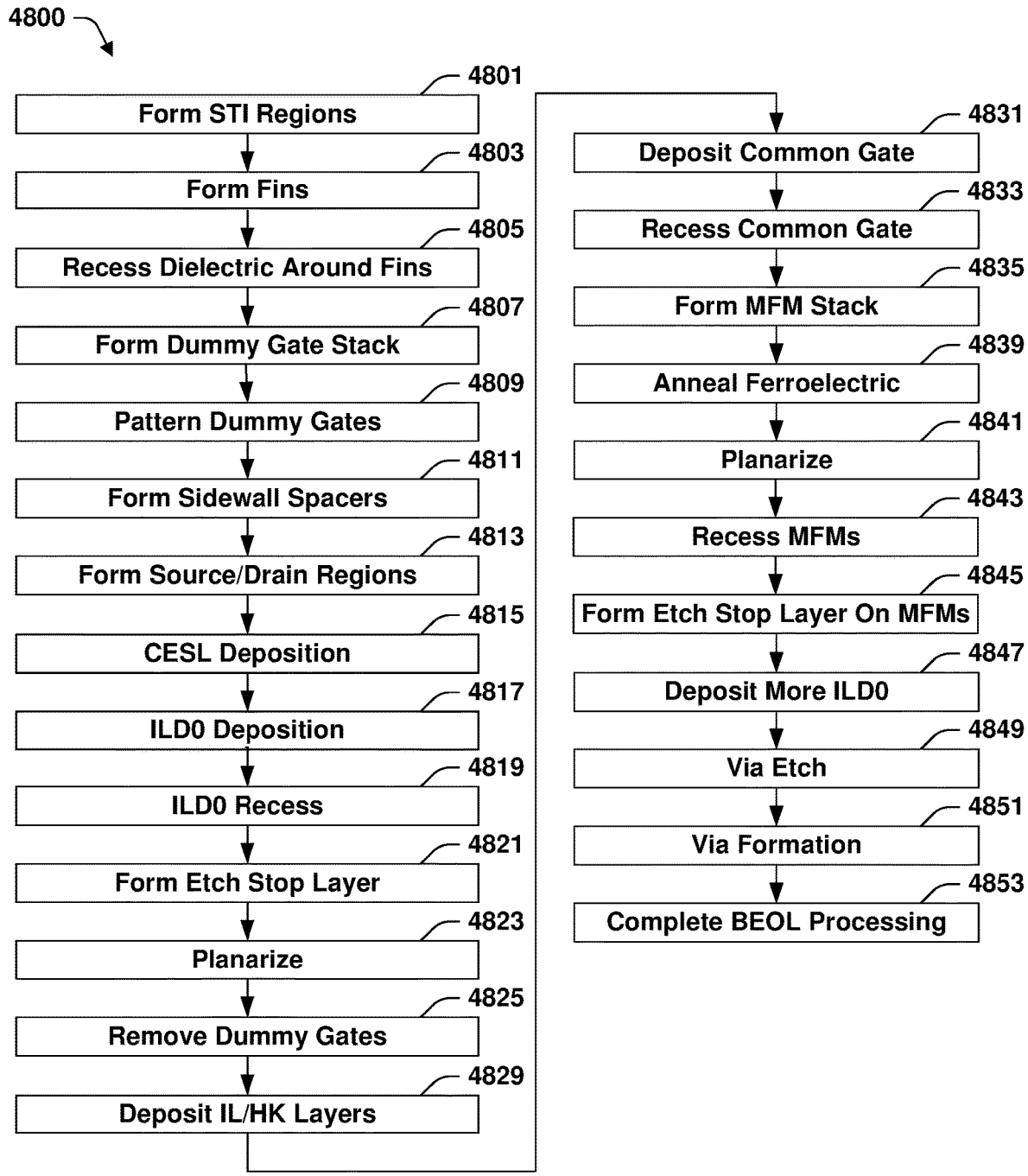
FIG. 48 presents a flow chart of a manufacturing process according to some aspects of the present teachings.

FIG. 48 provides a flow chart of a process 4800 according to some aspects of the present teachings. Process 4800 may be used to produce integrated circuit devices according to the present teachings. While process 4800 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 8:
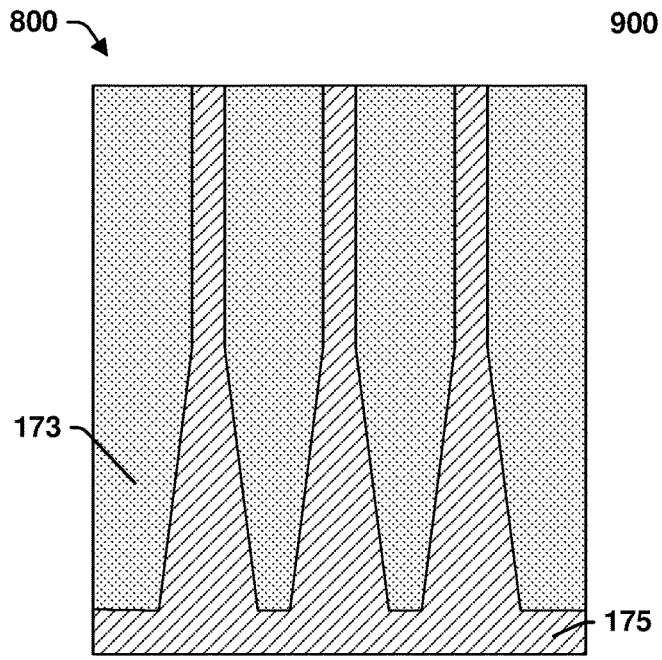
Figure 9:
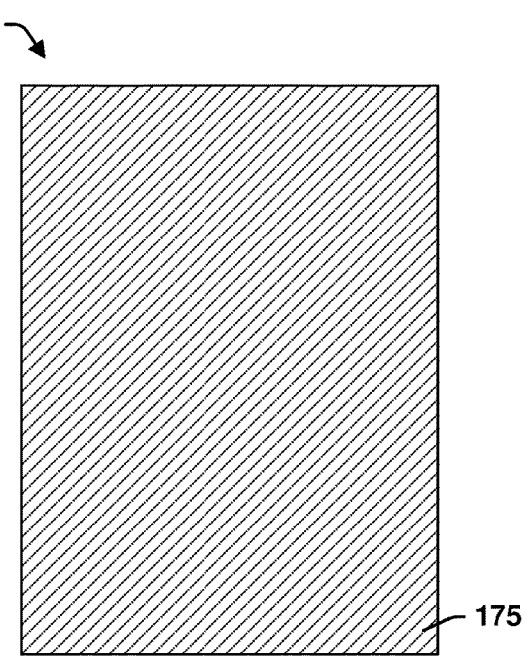

Process 4800 begins with act 4801, forming STI regions 173 as illustrated by cross-sectional views 600 and 800 of FIGS. 6 and 8. Process 4800 continues with act 4803, forming fins 151 as illustrated by cross-sectional views 1000 to 1300 of FIGS. 10 and 13. This may include forming recesses in a dielectric such as that of STI regions 173 and growing semiconductor within the resulting recesses. In the alternative, any other suitable process may be used to form fins 151.

Act 4805 is recessing STI regions 173 or removing other dielectric around fins 151 to expose fins 151 as shown by cross-sectional view 1400 of FIG. 14. Act 4807 is forming a dummy gate stack 1601 over fins 151 as shown by cross-sectional views 1600 and 1700 of FIGS. 16 and 17. Alternatively, this could be a regular gate stack and subsequent steps related to the replacement gate process could be eliminated. Act 4809 is patterning dummy gate stack 1601 to produce dummy gates 1803 as shown by cross-sectional views 1800 and 1900 of FIGS. 18 and 19.

Act 4811 is forming sidewall spacers 165 around dummy gates 1803 as shown by cross-sectional view 2100 of FIG. 21. Act 4813 is forming source/drain regions 2301 as shown by cross-sectional view 2300 of FIG. 23. Forming source/drain regions 2301 may include doping before and/or after act 4811, forming sidewall spacers 165. Forming source/drain regions 2301 may also include epitaxial growth of semiconductor.

Act 4815 is depositing CESL 163 as shown by the cross-sectional view 2500 of FIG. 25. Act 4817 is forming ILD0 161, as is also shown by the cross-sectional view 2500 of FIG. 25. Forming ILD0 161 may include depositing dielectric and planarizing to form a structure like the one illustrated.

Act 4819 is an etching process to recess ILD0 161 below the height of spacers 165. Act 4821 is depositing etch stop layer 2701. Act 4823 is planarizing to leave etch stop layer 2701 only within the recesses created by act 1817 as shown by the cross-sectional view 2700 of FIG. 27.

Act 4825 is removing dummy gates 1803 as shown by cross-sectional views 2800 and 2900 of FIGS. 28 and 29. Acts 4829 and 4831 form a replacement high-κ metal gate (HKMG) gate stack as shown by cross-sectional views 3000 and 3100 of FIGS. 30 and 31. Act 4829 is forming insulator 169, which may include an interfacial layer (IL) and a high-κ dielectric layer. Act 4831 is forming common gate 167, which is the gate of FET 143 and will provide the bottom electrode layer of MFM 127. Common gate 167 may also be described as a floating gate and may include multiple layers of various materials as illustrated by cross-sectional views 3200 to 3500 of FIGS. 32 and 35.

Act 4833 is an etch process to recess common gate 167 below a height of spacers 165 as shown by cross-sectional views 3600 and 3700 of FIGS. 36 and 37. The space (recesses 3703) created by this recessing process will house ferroelectric layer 135 and top electrode 133 of MFM 127.

Act 4835 is depositing ferroelectric layer 135 and top electrode 133 to form an MFM cell stack as shown in cross-sectional views 3800 and 3900 of FIGS. 38 and 39. Act 4839 is an annealing process that may be used to realize a ferroelectric property in ferroelectric layer 135. Act 4841 is planarizing to remove the portion of the MFM cell stack outside the recesses 3703. The planarization process defines MFMs 127 from the MFM cell stack as shown by the cross-sectional views 4000 and 4100 of FIGS. 40 and 41. Planarization also completes the definition of individual MFMIS-FETs 125. Planarization may also remove etch stop layer 2701.

Act 4843 is an etch process to recess MFMs 127 below a height of spacers 165 forming recesses 4301 as shown by the cross-sectional view 4300 of FIG. 43. Act 4845 is depositing etch stop layer 131 and planarizing whereby etch stop layer 131 is confined to recesses 4301 as shown by the cross-sectional view 4500 of FIG. 45.

Act 4847 is depositing a layer of interlevel dielectric 105, which may be considered another layer of ILD0 161, as shown by the cross-sectional views 4600 and 4700 of FIGS. 46 and 47. Act 4849 is etching openings through interlevel dielectric 105 for vias 107 and act 4851 is filling those openings with conductive material to form vias 107 as also shown by the cross-sectional views 4600 and 4700 of FIGS. 46 and 47 and by FIG. 2. Act 4853 encompasses additional actions to complete BEOL processing and the formation of a device such as IC device 100 of FIG. 1.

Some aspects of the present teachings relate to an integrated circuit (IC) including a substrate, a field-effect transistor (FET), and a metal-ferroelectric-metal structure (MFM). The FET includes a gate electrode and one or more channel regions separated from the gate electrode by an insulator. The MFM structure includes a top electrode and a bottom electrode separated by a ferroelectric layer. The gate electrode is coupled to the bottom electrode or is essentially the same structure as the bottom electrode. The FET has an effective area related to capacitance of the FET. The FET has a footprint over the substrate. The effective area of the FET is greater than the footprint of the FET.

Some aspects of the present teachings relate to an integrated circuit (IC) including a metal-ferroelectric-metal structure and a plurality of field-effect transistor structures. The metal-ferroelectric-metal structure includes a top electrode and a bottom electrode separated by a ferroelectric layer. The plurality of field-effect transistor structures each includes semiconductor source/drain regions separated by a semiconductor channel region, a gate electrode, and an insulator between the gate electrode and the channel region. The gate electrodes are coupled to or unitary with the bottom electrode.

Some aspects of the present teaching relate to a method of manufacturing an integrated circuit (IC) having a MFMIS-FET. The method includes forming a semiconductor fin forming a dummy gate stack over the semiconductor fin, patterning the dummy gate stack to define a dummy gate, forming a sidewall spacer around the dummy gate, and replacing the dummy gate with a MFMIS-FET that includes a high-κ dielectric, a metal gate, a ferroelectric layer and a top electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated circuit (IC) comprising a MFMIS-FET, the method comprising:
   forming a semiconductor fin over a substrate;
   forming a dummy gate stack over and on two sides of the semiconductor fin;
   patterning the dummy gate stack to define a dummy gate;
   forming a sidewall spacer around the dummy gate;
   etching away a portion of the dummy gate to create a void region flanked by the sidewall spacers; and
   after creating the void region, performing a series of depositions that comprise depositing a high-κ dielectric, a metal gate, a ferroelectric layer, and a top electrode layer, wherein the series of depositions fill the void region.

2. The method of claim 1, wherein
   depositing the high-κ dielectric and the metal gate fills the void region and the method further comprises:
   after depositing the metal gate, recessing the metal gate below a height of the sidewall spacer to form a recess,
   wherein the forming a ferroelectric layer and the top electrode layer are deposited within the recess.

3. The method of claim 1, wherein the dummy gate is formed over a plurality of semiconductor fins.

4. The method of claim 1, further comprising:
   etching the top electrode layer below a height of the sidewall spacer to form a second recess; and
   filling the second recess to form an etch stop layer over the top electrode layer.

5. The method of claim 1, further comprising:
   before etching away a portion of the dummy gate, filling a space around the sidewall spacer with an interlevel dielectric;
   etching to recess the interlevel dielectric below a height of the sidewall spacer to form a recess; and
   filling the recess with a dielectric to form an etch stop layer.

6. A method of manufacturing an integrated circuit (IC), the method comprising:
   forming a dummy gate stack including a dummy gate electrode layer;
   patterning the dummy gate stack to form dummy gates;
   forming sidewall spacers around the dummy gates;
   replacing the dummy gate electrode layer of the dummy gates with a first metal layer;
   planarizing an upper surface of the first metal layer;
   etching to recess the first metal layer to below a height of the sidewall spacers; and
   depositing a ferroelectric layer and a top electrode layer directly over the first metal layer.

7. The method of claim 6, further comprising planarizing an upper surface of the top electrode layer to align with an upper surface of the sidewall spacers.

8. The method of claim 7, further comprising:
   etching the upper surface of the top electrode layer below the height of the sidewall spacers to form a second recess; and
   filling the second recess with dielectric.

9. The method of claim 6, wherein the dummy gates have a FinFET or gate-all-around structure.

10. The method of claim 6, wherein the dummy gates each comprise a plurality of semiconductor fins.

11. The method of claim 6, further comprising:
    before replacing the dummy gate electrode layer, filling around the sidewall spacers with an interlevel dielectric;
    etching to recess the interlevel dielectric below a height of the sidewall spacers to form recesses; and
    filling the recesses with a dielectric to form an etch stop layer.

12. The method of claim 6, wherein the first metal layer comprises a layer of a work functional metal and a layer of a second metal.

13. A method of manufacturing an integrated circuit (IC), the method comprising:
    forming dummy gates having FinFET or gate-all-around structure; and
    replacing the dummy gates with a high-k dielectric, a first electrode layer, a ferroelectric layer, and a second electrode layer according to a process that includes chemical mechanical polishing of an upper surface of the first electrode layer followed by recessing the upper surface by etching.

14. The method of claim 13, wherein the ferroelectric layer and second electrode layer are formed within a recess formed by the recessing the upper surface.

15. The method of claim 13, wherein the dummy gates comprise a plurality of semiconductor fins.

16. The method of claim 13, further comprising:
    forming sidewall spacers around the dummy gates;
    wherein the chemical mechanical polishing aligns the upper surface with tops of the sidewall spacers.

17. The method of claim 16, further comprising:
    etching to recess the second electrode layer below the tops of the sidewall spacers to form recesses; and
    filling the recesses with a dielectric.

18. The method of claim 13, wherein the dummy gates each comprise a plurality of semiconductor fins.

19. The method of claim 16, further comprising:
    before replacing the dummy gates, filling a space around the sidewall spacers with an interlevel dielectric;
    etching to recess the interlevel dielectric below a height of the sidewall spacers to form recesses; and
    filling the recesses to form an etch stop layer.

20. The method of claim 13, wherein the first electrode layer comprises a layer of a work functional metal and a layer of a second metal.

* * * * *